United States Patent
Herr

(10) Patent No.: US 10,355,696 B1
(45) Date of Patent: Jul. 16, 2019

(54) JOSEPHSON POLARITY AND LOGICAL INVERTER GATES

(71) Applicant: Quentin P. Herr, Ellicott City, MD (US)

(72) Inventor: Quentin P. Herr, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/047,883

(22) Filed: Jul. 27, 2018

Related U.S. Application Data

(63) Continuation of application No. 15/887,524, filed on Feb. 2, 2018, now Pat. No. 10,090,841.

(51) Int. Cl.
  *H03K 19/195* (2006.01)
  *G06N 10/00* (2019.01)

(52) U.S. Cl.
  CPC ......... *H03K 19/1954* (2013.01); *G06N 10/00* (2019.01)

(58) Field of Classification Search
  None
  See application file for complete search history.

(56) References Cited

U.S. PATENT DOCUMENTS

| | | | |
|---|---|---|---|
| 5,051,627 A | 9/1991 | Schneier et al. | |
| 6,229,332 B1 | 5/2001 | Herr | |
| 7,786,748 B1 | 8/2010 | Herr | |
| 9,543,959 B1 | 1/2017 | Carmean et al. | |
| 2009/0002014 A1 | 1/2009 | Gupta | |
| 2009/0237106 A1* | 9/2009 | Kirichenko | G06F 5/08 326/4 |
| 2015/0254571 A1 | 9/2015 | Miller | |

FOREIGN PATENT DOCUMENTS

| | | |
|---|---|---|
| CN | 101626233 A | 1/2010 |
| CN | 101626234 A | 1/2010 |
| WO | 2008089067 | 7/2008 |

OTHER PUBLICATIONS

International Written Opinion and Search Report corresponding to International Application No. PCT/US2018/056310 dated Jan. 22, 2019.

International Written Opinion and Search Report corresponding to International Application No. PCT/US2018/056316 dated Jan. 25, 2019.

(Continued)

*Primary Examiner* — Anh Q Tran
(74) *Attorney, Agent, or Firm* — Tarolli, Sundheim, Covell & Tummino LLP

(57) ABSTRACT

A Josephson inverter gate circuit provides efficient implementation of polarity or logical inversion while eliminating the need for physically large high-efficiency magnetic transformers in the signal path. The circuit can consist of a half-twisted Josephson transmission line (JTL) or a JTL with an unshunted floating Josephson junction that produces two single flux quantum (SFQ) pulses when triggered by an SFQ input signal, which results in an output SFQ signal of reversed polarity. Implemented as a logical inverter, proper initialization of the circuit is accomplished within the signal inversion stage with flux biasing.

20 Claims, 20 Drawing Sheets

(56) References Cited

OTHER PUBLICATIONS

International Written Opinion and Search Report corresponding to International Application No. US/PCT2018/056305 dated Jan. 30, 2019.
Narendran, S. et al.: "Quantum computation based on Reciprocal Quantum logic", 2017 International Conference on Nextgen Electronic Technologies; Silicon to Software (ICNETS2), IEEE, Mar. 23, 2017 (Mar. 23, 2017), pp. 34-37 Retrieved on Oct. 13, 2017. p. 25, right hand column, paragraph 1; figures 6,7.
Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.
Kotani S. et al.: "Ultrahigh-speed logic gate family with Nb/Al-A10 x / Nb Josephson junctions", IEEE Transactions on Election Devices, vol. 33, No. 3, Mar. 1, 1986 (Mar. 1, 1986), pp. 379-384.

\* cited by examiner

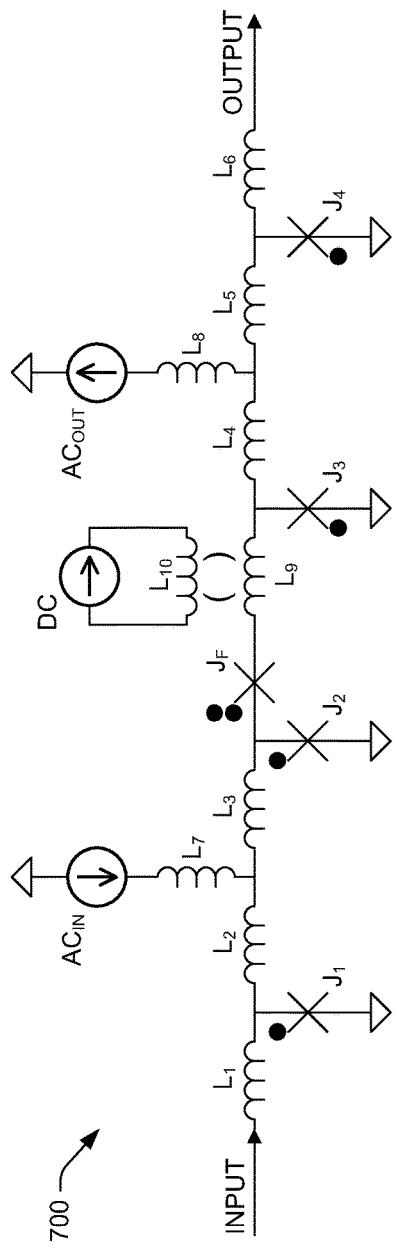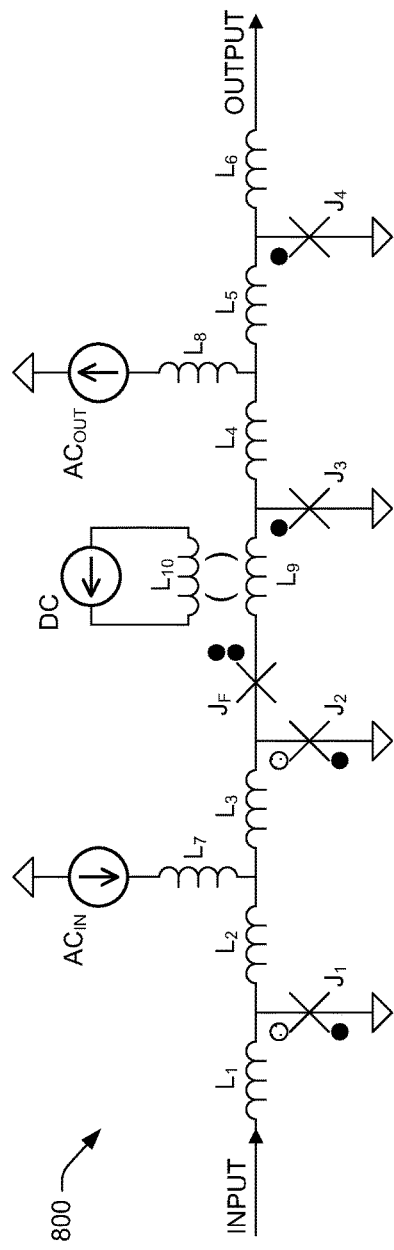

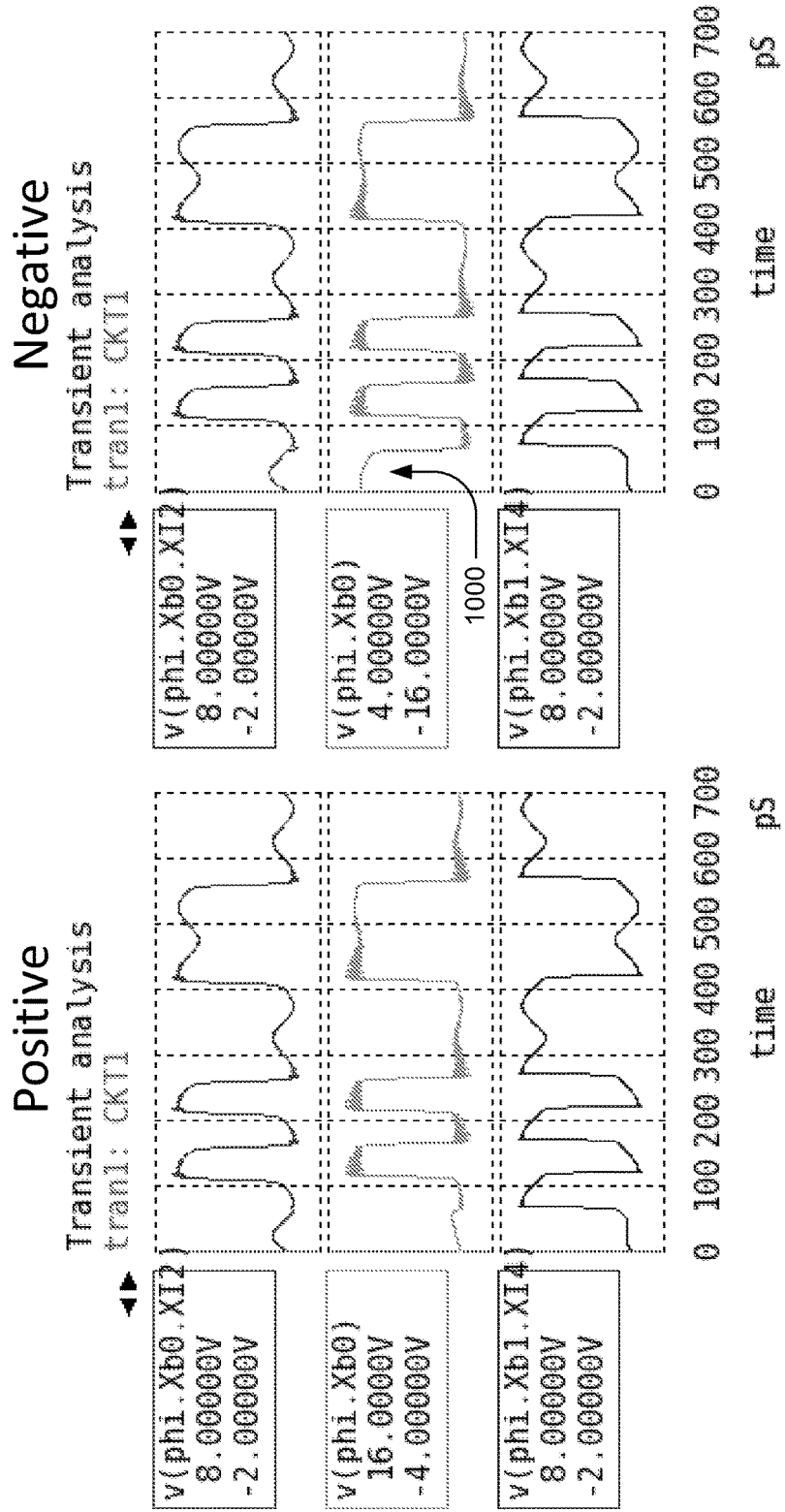

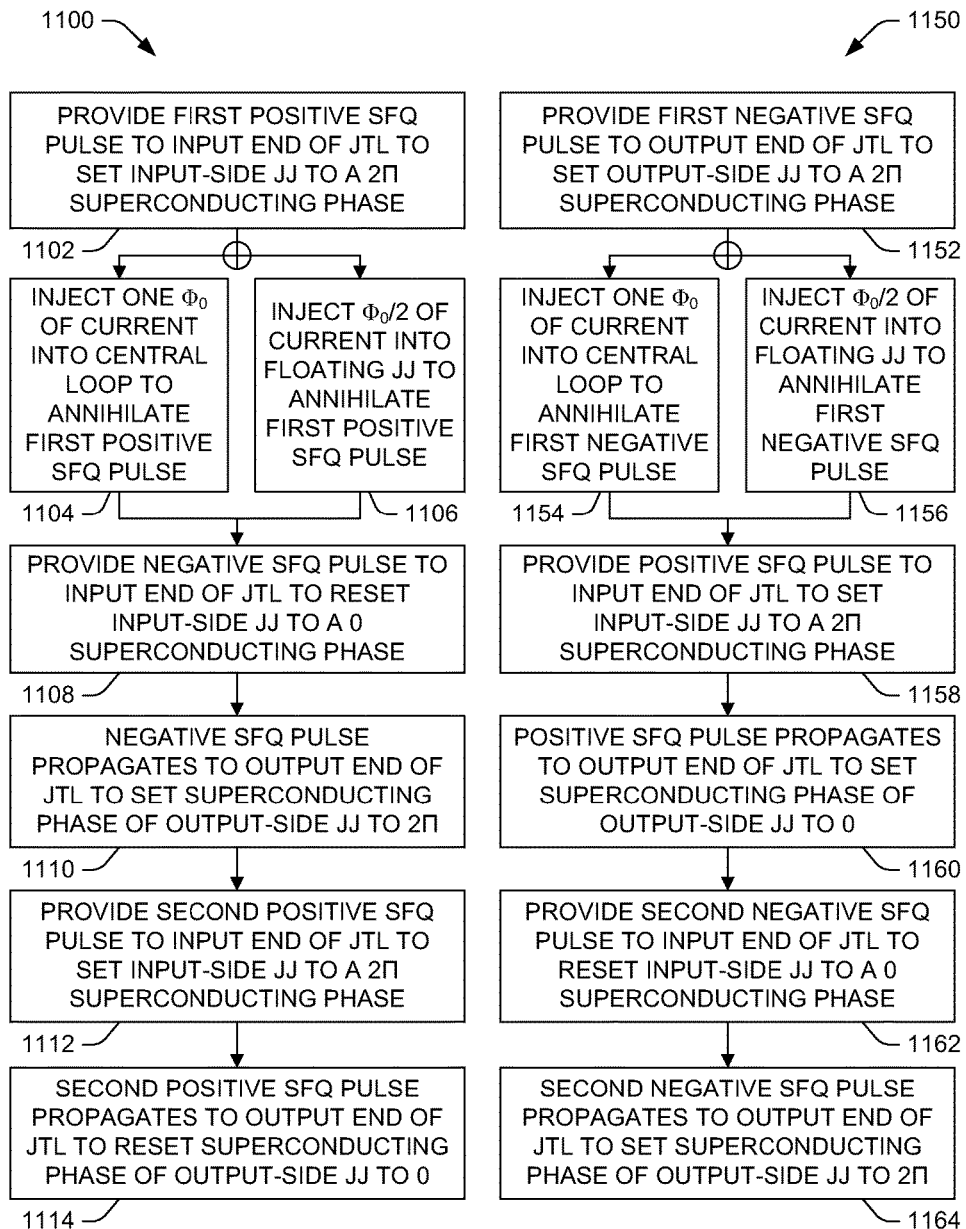
FIG. 11A  FIG. 11B

JOSEPHSON POLARITY AND LOGICAL INVERTER GATES

CROSS-REFERENCE TO RELATED APPLICATION

This application is a continuation of, and claims priority to, co-pending U.S. patent application Ser. No. 15/887,524, filed 2 Feb. 2018.

TECHNICAL FIELD

The present invention relates generally to quantum and classical digital superconducting circuits, and specifically to Josephson polarity and logical inverter gates.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

An inverter is an electrical circuit device capable of inverting an input signal into an output. A polarity inverter inverts the polarity of an input signal such that a positive input value having some magnitude is inverted to produce an output signal, or result in an output state, having a negative input value equal in magnitude to the input value but opposite in sign or polarity. In digital logic contexts having only two logical senses, a logical inverter is a gate capable of inverting a logical input into a logical output having the opposite logical sense of the logical input. Thus, an inverted "low" or "0" logical input provides a "high" or "1" logical output, and vice-versa. A polarity inverter can invert the polarity of an input signal in a manner that many involve more states than the binary states associated with logical inversion, e.g., three states or more.

SUMMARY

One example provides a Josephson inverter gate circuit. The circuit includes an input to provide an input signal made up of at least one single flux quantum (SFQ) pulse, and a half-twisted Josephson transmission line (JTL) comprising at least four Josephson junctions arranged to propagate the input signal to an output and to invert the input signal into an output signal. The half-twisted JTL can have a central loop. The inverter gate circuit can be a polarity inverter, such that an output-end Josephson junction in the half-twisted JTL exhibits a $-2\pi$ superconducting phase upon propagation to the output of an input signal that sets an input-end Josephson junction to a $2\pi$ superconducting phase, and the output-end Josephson junction exhibits a 0 superconducting phase upon propagation to the output of an input signal that resets the input-end Josephson junction to a 0 superconducting phase. Alternatively, the inverter gate circuit can be a logical inverter, such that, after a transient start-up period, the output-end Josephson junction exhibits a 0 superconducting phase upon propagation to the output of an input signal that sets the input-end Josephson junction to a $2\pi$ superconducting phase, and the output-end Josephson junction exhibits a $2\pi$ superconducting phase upon propagation to the output of an input signal that resets the input-end Josephson junction to a 0 superconducting phase.

Another example provides a method of logically inverting a signal value based on SFQ pulse inputs. A first positive SFQ pulse is provided to an input end of a half-twisted JTL to set an input-side Josephson junction in the half-twisted JTL (i.e., a Josephson junction that is nearer the input end of the half-twisted JTL than an output end of the half-twisted JTL) to a $2\pi$ superconducting phase. Before or after providing the first positive SFQ pulse, but before the first positive SFQ pulse can propagate through a central loop of the half-twisted JTL toward the output, one $\Phi_0$ of current is injected into the central loop as an initializing current, such that the first positive SFQ pulse is annihilated by the initializing current and does not propagate through the central loop toward the output end of the half-twisted JTL. This does not affect the superconducting phase of the input-side Josephson junction. Then, a negative SFQ pulse is provided to the input end of the half-twisted JTL to reset the input-side Josephson junction to a 0 superconducting phase, such that the negative SFQ pulse propagates to the output end of the half-twisted JTL to set to $2\pi$ the superconducting phase of an output-side Josephson junction in the half-twisted JTL (i.e., a Josephson junction that is nearer the output end of the half-twisted JTL than the input end of the half-twisted JTL). The method can continue by providing a second positive SFQ pulse to the input end of the half-twisted JTL to set the input-side Josephson junction to a $2\pi$ superconducting phase, such that the second positive SFQ pulse propagates to the output end of the half-twisted JTL to reset to 0 the superconducting phase of the output-side Josephson junction.

Another example provides another method of logically inverting a signal value based on SFQ pulse inputs. A first positive SFQ pulse is provided to an input end of a JTL having a floating Josephson junction in a central portion of the JTL to set an input-side Josephson junction in the JTL to a $2\pi$ superconducting phase. Before or after providing the first positive SFQ pulse, but before the first positive SFQ pulse can propagate through the central portion of the JTL toward the output, $\Phi_0/2$ of current is injected into the floating Josephson junction as an initializing current, such that the first positive SFQ pulse is annihilated by the initializing current and does not propagate through the central portion toward the output end of the JTL. This does not affect the superconducting phase of the input-side Josephson junction. Then, a negative SFQ pulse is provided to the input end of the JTL to reset the input-side Josephson junction to a 0 superconducting phase, such that the negative SFQ pulse propagates to the output end of the JTL to set to $2\pi$ the superconducting phase of an output-side Josephson junction in the JTL. The method can continue by providing a second positive SFQ pulse to the input end of the JTL to set the input-side Josephson junction to a $2\pi$ superconducting phase, such that the second positive SFQ pulse propagates to the output end of the JTL to reset to 0 the superconducting phase of the output-side Josephson junction.

Another example provides yet another method of logically inverting a signal value based on SFQ pulse inputs. A first negative SFQ pulse is provided to an output end of a half-twisted JTL to set an output-side Josephson junction in the half-twisted JTL to a $2\pi$ superconducting phase. Before or after providing the first negative SFQ pulse, but before the first negative SFQ pulse can propagate through a central loop of the half-twisted JTL toward the input, one $\Phi_0$ of current is injected into the central loop as an initializing current, such that the first negative SFQ pulse is annihilated by the initializing current and does not propagate through the central loop toward the input end of the half-twisted JTL. This does not affect the superconducting phase of the output-side Josephson junction. Then, a positive SFQ pulse is provided to the input end of the half-twisted JTL to set the input-side Josephson junction to a $2\pi$ superconducting phase, such that the positive SFQ pulse propagates to the output end of the half-twisted JTL to set to 0 the superconducting phase of the output-side Josephson junction in the half-twisted JTL. The method can continue by providing a second negative SFQ pulse to the input end of the half-twisted JTL to reset the input-side Josephson junction to a 0 superconducting phase, such that the second negative SFQ pulse propagates to the output end of the half-twisted JTL to set to $2\pi$ the superconducting phase of the output-side Josephson junction.

Another example provides still another method of logically inverting a signal value based on SFQ pulse inputs. A first negative SFQ pulse is provided to an output end of a JTL having a floating Josephson junction in a central portion of the JTL to set an output-side Josephson junction in the JTL to a $2\pi$ superconducting phase. Before or after providing the first negative SFQ pulse, but before the first negative SFQ pulse can propagate through the central portion of the JTL toward the input, $\Phi_0/2$ of current is injected into the floating Josephson junction as an initializing current, such that the first negative SFQ pulse is annihilated by the initializing current and does not propagate through the central portion toward the input end of the JTL. This does not affect the superconducting phase of the output-side Josephson junction. Then, a positive SFQ pulse is provided to the input end of the JTL to set the input-side Josephson junction to a $2\pi$ superconducting phase, such that the positive SFQ pulse propagates to the output end of the JTL to reset to 0 the superconducting phase of the output-side Josephson junction in the JTL. The method can continue by providing a second negative SFQ pulse to the input end of the JTL to reset the input-side Josephson junction to a 0 superconducting phase, such that the second negative SFQ pulse propagates to the output end of the JTL to set to $2\pi$ the superconducting phase of the output-side Josephson junction.

Yet another example provides a superconducting reciprocal quantum logic (RQL) inverter circuit made up of an input end, an output end, and a central portion connecting the input end and the output end. The central portion includes at least one of a central loop comprising at least two JJs, and/or a floating Josephson junction in series with a transformer-coupled DC flux bias injection source configured to inject one $\Phi_0$ of current. The input end includes a first inductor connected between an input node and a first node, a first Josephson junction connected between the first node and a circuit ground, a second inductor connected between the first node and a second node, a second Josephson junction connected between the second node and a third node, and a third inductor connected between the third node and the circuit ground. The output end includes a fourth inductor connected between a fourth node and the circuit ground, a third Josephson junction connected between the fourth node and a fifth node, an fifth inductor connected between the fifth node and a sixth node, a fourth Josephson junction connected between the sixth node and the circuit ground, and a sixth inductor connected between the sixth node and an output node.

Still another example provides a Josephson inverter gate circuit. The circuit includes an input to provide an input signal made up of at least one single flux quantum (SFQ) pulse, and a JTL comprising at least five Josephson junctions arranged to propagate the input signal to an output and to invert the input signal into an output signal, one of them being a floating Josephson junction located centrally in the JTL. The inverter gate circuit can have a single DC flux bias input to provide an initializing current to the floating Josephson junction. The inverter gate circuit can be a polarity inverter or logical inverter, as defined with regard to the first example.

Still yet another example provides a superconducting reciprocal quantum logic (RQL) inverter circuit made up of an input end, an output end, and a central portion connecting the input end and the output end, the central portion comprising a floating Josephson junction and a transformer-coupled DC flux bias injection source configured to inject one $\Phi_0$ of current. The input end includes a first inductor connected between an input node and a first node, a first Josephson junction connected between the first node and a circuit ground, a second inductor connected between the first node and a second node, a third inductor connected between the second node and a third node, and a second Josephson junction connected between the third node and the circuit ground. The output end includes a third Josephson junction connected between a fifth node and the circuit ground, a seventh inductor connected between the fifth node and a sixth node, an eighth inductor connected between the sixth node and a seventh node, a fourth Josephson junction connected between the seventh node and the circuit ground, and a tenth inductor connected between the seventh node and an output node. The circuit can further include two bias inputs each providing a bias signal having an AC component, the first bias input connected via a fourth inductor connected to the circuit at the second node, and the second bias input connected via a ninth inductor connected to the circuit at the sixth node.

BRIEF DESCRIPTION OF THE DRAWINGS

FIG. 7 is a schematic of a Josephson polarity inverter gate using a JTL that includes a floating Josephson junction.

FIG. 8 is a schematic of a Josephson logical inverter gate using a JTL that includes a floating Josephson junction.

FIG. 9 is a graph of simulation results for the example logical inverter gate of FIG. 8 having positive central DC flux bias.

FIG. 10 is a graph of simulation results for the example logical inverter gate of FIG. 8 having negative central DC flux bias.

FIGS. 11A and 11B are flow charts illustrating methods of logically inverting a signal value based on single flux quantum (SFQ) pulse inputs.

DETAILED DESCRIPTION

Inversion in CMOS technology generally involves conversion of a low voltage to a high voltage or vice versa. Inversion of signals in circuits that use phase mode logic (PML) poses a more difficult problem, because in PML circuits, logical states are encoded as superconducting phases of, for example, Josephson junctions, such phases being set or reset with positive or negative pulses, e.g., single flux quantum (SFQ) pulses, that propagate through the circuits. The difference in encoding paradigm means that the techniques and structures of CMOS inversion methods are not assistive in achieving PML inversion, and new techniques and structures must be devised in order to implement a simple and effective PML inverter. Existing techniques for achieving signal inversion in phase-mode circuits, such as circuits from the family of reciprocal quantum logic (RQL) superconducting logic circuits, rely upon the use of a polarity-inverting transformer followed by a JTL that initializes to logical "high." However, the transformer is required to be physically large and high-efficiency.

This disclosure therefore relates generally to logical gate circuits for use in superconducting systems. In some examples, a one-input, one-output superconducting inverter gate can provide polarity inversion of phase mode logic inputs. In other examples, a one-input, one-output superconducting inverter gate can provide logical inversion of phase mode logic inputs. Thus, for example, when "low" and "high" logic states are encoded as 0 and $2\pi$ superconducting phases of Josephson junctions, respectively, a gate in a superconducting circuit, such as in an RQL superconducting circuit, can be configured to deliver a negative SFQ pulse on a gate output in response to a positive SFQ pulse on a gate input, and to deliver a positive SFQ pulse on a gate output in response to a negative SFQ pulse on a gate input. These pulses can set or reset the phases of Josephson junctions encoding the corresponding logical "low" or "high" states. The inverters described herein eliminate the need for physically-large, high-efficiency transformers on the signal path.

Figure 1A:
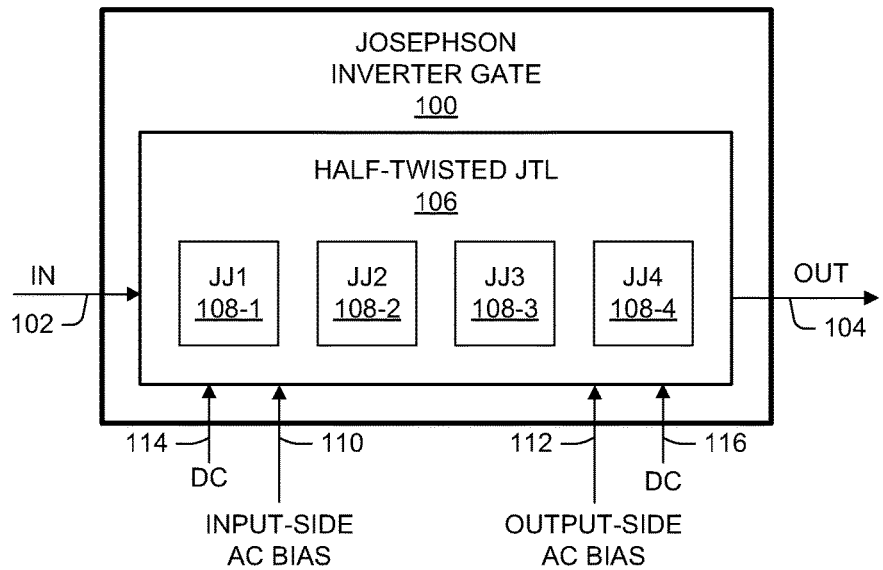
FIG. 1A is a block diagram of an example Josephson inverter gate having a half-twisted Josephson transmission line (JTL).

FIG. 1A is a block diagram of an example Josephson inverter gate 100 having input IN 102 and output OUT 104 corresponding to an inversion of input IN 102. Depending on the configuration of Josephson inverter gate 100, output OUT 104 can provide a polarity inversion or a logical inversion of input IN 102. Inverter gate 100 includes half-twisted Josephson transmission line (JTL) 106, which includes at least four Josephson junctions (JJs) 108-1, 108-2, 108-3, 108-4, and which receives inputs from two AC bias lines 110, 112 opposite in phase from each other. By "half-twisted JTL," it is meant that the structure of a conventional JTL has had a half-twist applied to it, such that the ground reference at the output is on the opposite side of the JTL relative to the input, and such that the half-twisted JTL inverts the polarity of an applied SFQ voltage pulse. The inverter gate 100 can include more than four Josephson junctions. Inverter gate 100 can also include one or more DC inputs 114, 116, which can be provided to establish initializing conditions on half-twisted JTL 106 at system start-up. For example, DC inputs 114, 116 can each inject $\psi_0/2$ worth of current into a central loop of half-twisted JTL 106. In some examples, the two $\Phi_0/2$ currents can be provided to cancel each other out. In other examples, the two $\Phi_0/2$ currents can be provided to sum to a full $\Phi_0$ and thus to place one whole $\Phi_0$ worth of current into the central loop. Signals provided to and by input IN 102 and output OUT 104 can consist of positive or negative single flux quantum (SFQ) pulses corresponding to asserted or de-asserted logic states, respectively. Corresponding input and output logic states can be stored on, i.e., encoded by, the superconducting phases of JTL Josephson junctions 108-1 through 108-4.

Figure 1B:
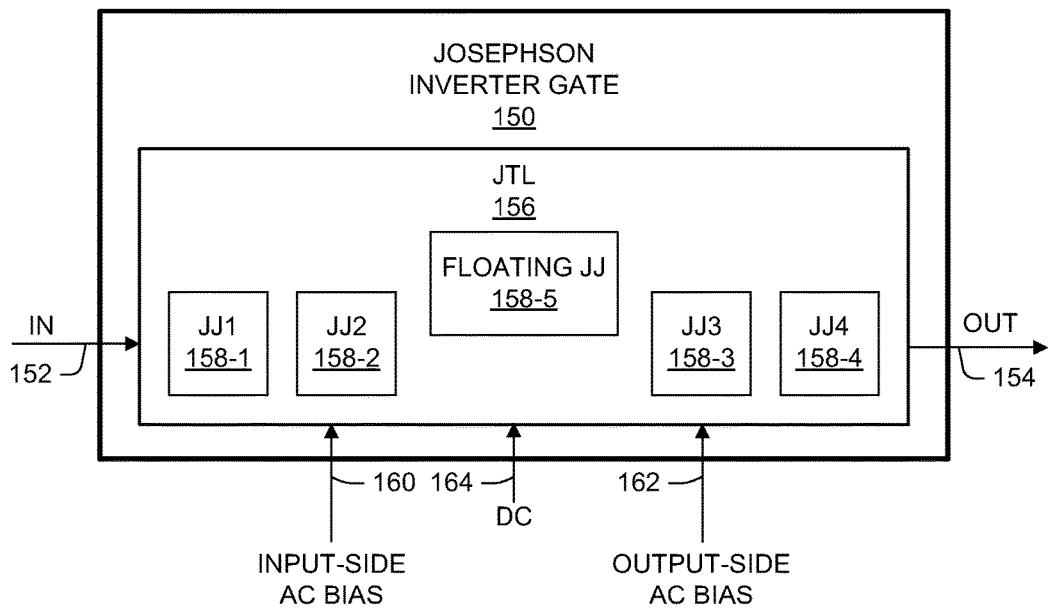
FIG. 1B is a block diagram of another example Josephson inverter gate having a JTL that includes a floating Josephson junction.

FIG. 1B is a block diagram of another example Josephson inverter gate 150 having input IN 152 and output OUT 154 corresponding to an inversion of input IN 152. As with gate 100, depending on the configuration of Josephson inverter gate 150, output OUT 154 can provide a polarity inversion or a logical inversion of input IN 152. Inverter gate 150 includes JTL 156, which includes at least four Josephson junctions (JJs) 108-1, 108-2, 108-3, 108-4, and, in addition, underdamped floating Josephson junction 158-5. "Floating" in this context means that neither of the Josephson junction terminals is grounded. JTL 156 receives inputs from two AC bias lines 160, 162, which are functionally, although not necessarily precisely, opposite in phase from each other. The inverter gate 150 can include more than four Josephson junctions. Inverter gate 150 can also include a DC input 164, which can be provided to establish initializing conditions on JTL 156 at system start-up. For example, DC input 164 can inject $\Phi_0/2$ of current into floating JJ 158-5. Signals provided to and by input IN 152 and output OUT 154 can consist of positive or negative single flux quantum (SFQ) pulses corresponding to asserted or de-asserted logic states, respectively. Corresponding input and output logic states can be stored on, i.e., encoded by, the superconducting phases of JTL Josephson junctions 158-1 through 158-4.

Figure 2:
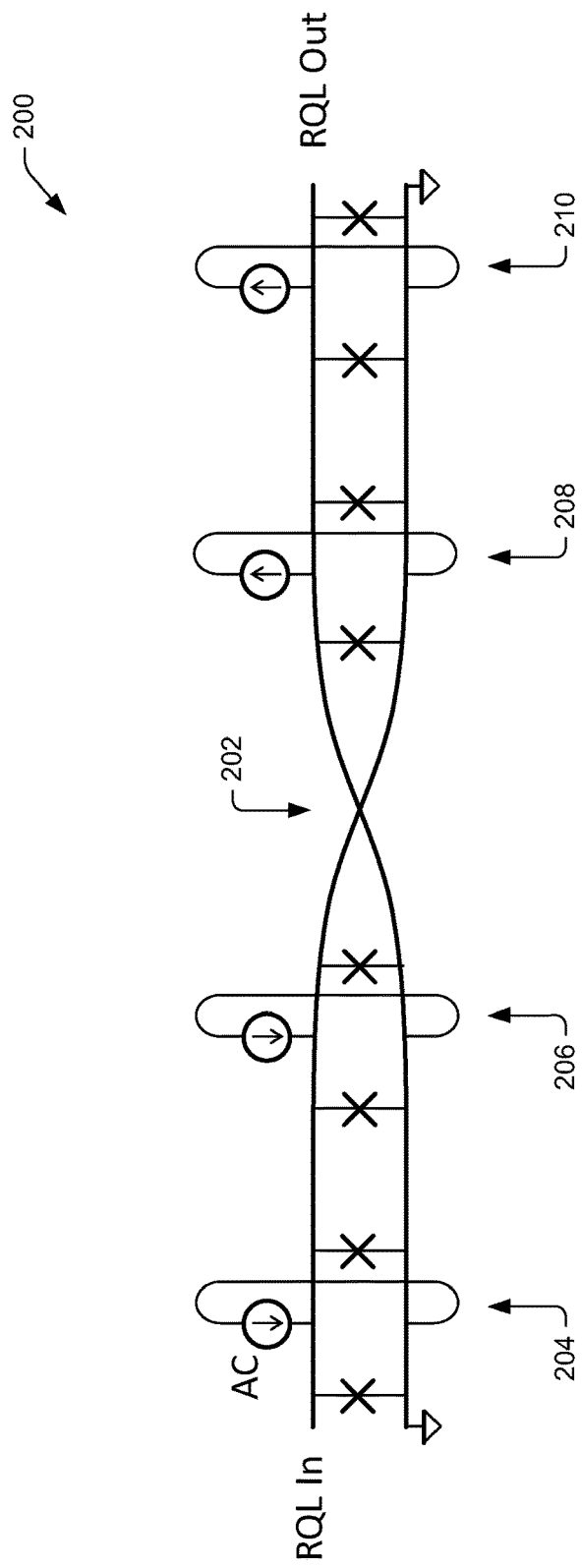
FIG. 2 is a schematic illustration of an example half-twisted JTL topology.

FIG. 2 illustrates the topology 200 of a JTL with a "half-twist," as discussed previously, consisting of AC-biased Josephson junctions with inductive interconnect shown as upper and lower bold lines that cross at a twist point 202 without electrically connecting at the twist point 202. The topology 200 can accommodate RQL data encoding, wherein every positive SFQ pulse is followed by a negative one.

Each end of the JTL 200 has an upper signal propagation side and a lower ground side, which are not voltage nodes but rather are inductive interconnects, such that there is appropriate isolation and gain between input and output. The half-twist 202 of the JTL 200 means that the signal propagation side becomes the ground side as the JTL 200 progresses from input to output. Because the connection between input RQL In and output RQL Out is inductive, the signal propagation side at the input can be grounded at the output without shorting out the topology 200. Each Josephson junction triggers locally, at times dictated in part by biasing provided by AC biases 204, 206, 208, 210, and by the time a signal propagates to the output, it has been inverted in voltage polarity. Because of half-twist 202, AC biases 208 and 210 are opposite in direction (i.e., inverted in AC phase) from AC biases 204, 206. Initialization of the output to logical high can be accomplished within the signal inversion stage with flux biasing (not shown in FIG. 2).

RQL circuits propagate logical changes as SFQ pulses or trains of such pulses. Inversion of signals therefore might be conceptualized to entail creation or annihilation of SFQ pulses to invert a signal train, but implementation of such functionality proves physically difficult. Therefore, rather than conceptualizing logic signals in terms of SFQ pulses, logic states can be conceptualized as superconducting phases of Josephson junctions used as logic elements, where phase is defined as the time-integral of voltage at every node. The half-twisted JTL topology 200 can convert high phase to low phase and vice-versa and thereby invert the polarity of an incoming SFQ voltage pulse provided at terminal RQL In, because instead of attempting to create or annihilate pulses, topology 200 flips Josephson junction phase polarities upside down between input and output. Although FIG. 2 shows half-twisted JTL 200 as having eight Josephson junctions, an inverter in accordance with the present disclosure can be made with fewer Josephson junctions.

Figure 3A:
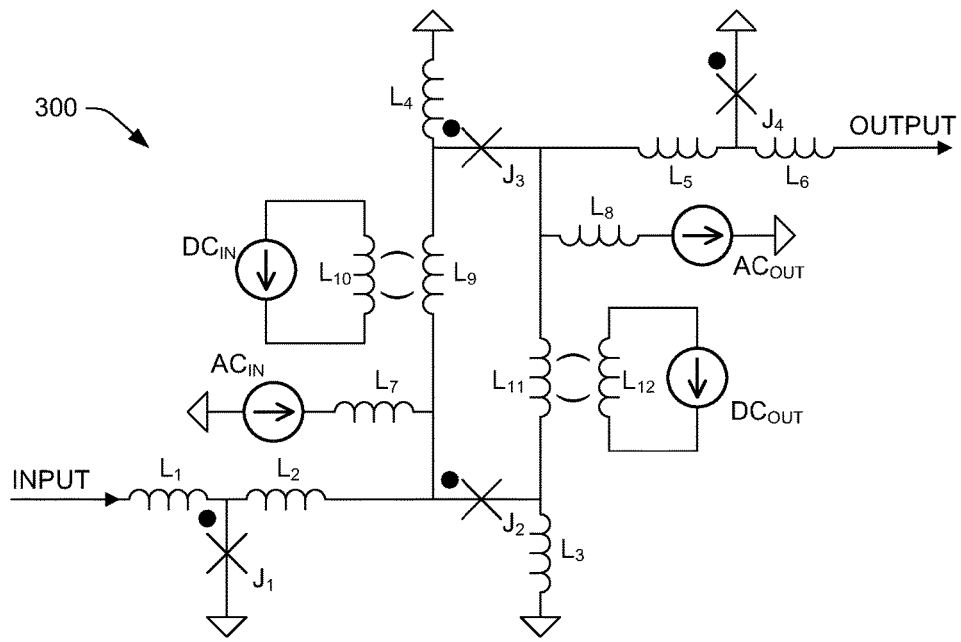
FIG. 3A is a schematic of an example Josephson polarity inverter gate using a half-twisted JTL.
Figure 3B:
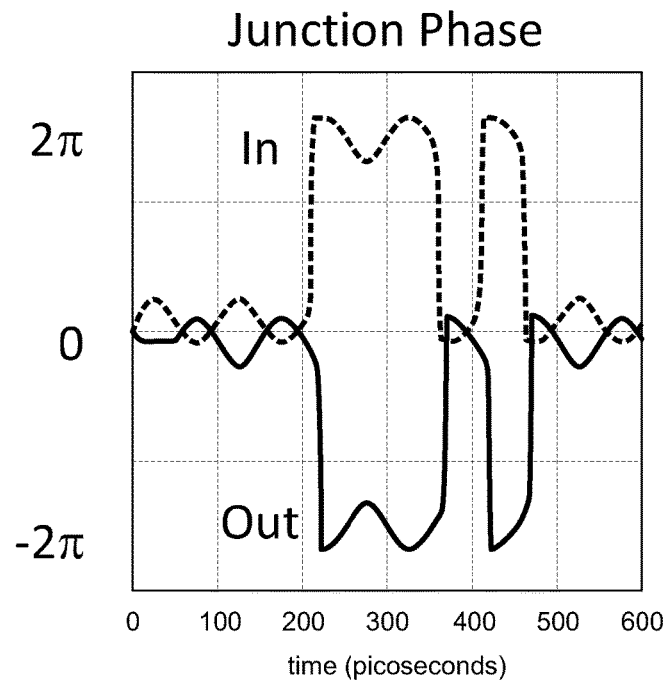
FIG. 3B is a graph of simulation results for the example gate of FIG. 3A.

FIG. 3A shows a schematic, with accompanying simulation result plots shown in FIG. 3B, of an RQL signal polarity inverter 300 with direct coupling, that follows the half-twist topology model of FIG. 2. With reference to dots placed near Josephson junctions $J_1$, $J_2$, $J_3$, $J_4$, circuit 300 is illustrated in a final state after a positive input pulse has propagated to the output. From an initial state (at the 0 picosecond mark in FIG. 3B) wherein all of the Josephson junctions $J_1$, $J_2$, $J_3$, $J_4$ are at 0 superconducting phase, an input signal provided as a positive SFQ pulse at the INPUT line causes the first Josephson junction $J_1$ to trigger (placing it in the $2\pi$ superconducting phase), which in turn triggers second Josephson junction $J_2$, which in turn triggers third Josephson junction $J_3$, which in turn triggers fourth Josephson junction $J_4$ (placing it in the $-2\pi$ superconducting phase). Fourth Josephson junction $J_4$ triggers with an "opposite" polarity as compared to the triggering of first Josephson junction $J_1$, as is indicated in FIG. 3A by the relative placement of Josephson junction superconducting phase dots near each Josephson junction. Thus, the OUTPUT line transmits a negative SFQ pulse in response to a positive SFQ pulse at the INPUT, and vice versa.

The superconducting phases at the input (e.g., as measured at first Josephson junction $J_1$) and the output (e.g., as measured at fourth Josephson junction $J_4$) are plotted in the graph of FIG. 3B. The input superconducting phase is plotted as a broken line and the output superconducting phase is plotted as a solid line. As can be seen in the graph, some short lag time after the input superconducting phase transitions from 0 to $2\pi$ (at around the 200 picosecond mark), the output superconducting phase transitions from 0 to $-2\pi$. Subsequently, when a negative pulse arrives at the input to restore the input superconducting phase to 0 (at around the 350 picosecond mark), the output superconducting phase also returns to 0. Then, when another positive pulse arrives at the input to again raise the input superconducting phase to $2\pi$ (at around the 400 picosecond mark), the output superconducting phase again presents the polar inversion of $-2\pi$ phase after a short propagation time. After that, when another negative pulse arrives at the input to again bring the input superconducting phase to 0 (at around the 450 picosecond mark), the output superconducting phase also returns to 0. The graph of FIG. 3B thus accurately characterizes the behavior of the polarity inverter 300 of FIG. 3A.

Still with regard to FIG. 3A, second and third junctions $J_2$ and $J_3$ are part of a superconducting loop in the center of circuit 300. AC bias signals $AC_{IN}$ and $AC_{OUT}$ can be, for example, AC sine wave signals that are equal in magnitude and are functionally, although not necessarily precisely, opposite in AC phase, as indicated by the relative pointing of the arrows in the symbols. Other relative AC phase assignments can also result in an operative circuit 300. In order to provide appropriate biasing, DC offset sources $DC_{IN}$ and $DC_{OUT}$ can each put $\Phi_0/2$ of current into the central loop shared by Josephson junctions $J_2$ and $J_3$ via transformer couplings $L_9/L_{10}$ and $L_{11}/L_{12}$, where $\Phi_0$ is approximately equal to 2.07 milliamps-picohenries. These $\Phi_0/2$ flux biases help maintain symmetry of the double-well potential in view of inductors to ground $L_3$ and $L_4$; the circuit would be loaded hard without the DC flux biases to compensate for the sending of the signal directly to ground via inductors $L_3$ and $L_4$. However, in circuit 300, with respect to any initialization current provided to the central loop, the functionally equal and opposite currents provided by the two DC sources $DC_{IN}$ and $DC_{OUT}$ cancel each other out. First junction $J_1$ is loaded to ground not through the inductor $L_3$ to ground at the bottom of circuit 300, but through the inductor $L_4$ to ground at the top of circuit 300. It may further be noted that in the polarity inverter of FIG. 3A, there is no high-efficiency transformer in the signal path. (As used here, a "high efficiency" transformer is one having a coefficient of coupling k greater than 0.5, i.e., $k=L_m/\sqrt{(L_p L_s)}>0.5$, where $L_m$ is mutual inductance and $L_p$ and $L_s$ are the respective self-inductances of the primary and secondary inductors. In circuit 300, the $L_9/L_{10}$ and $L_{11}/L_{12}$ transformers are not in the signal path in that the primary inductors $L_{10}$ and $L_{12}$ transmit DC biases that can have arbitrary amplitude irrespective of signal amplitude.) Thus, coupling can be arbitrarily small with proportionate scaling of the DC bias current.

Figure 3C:
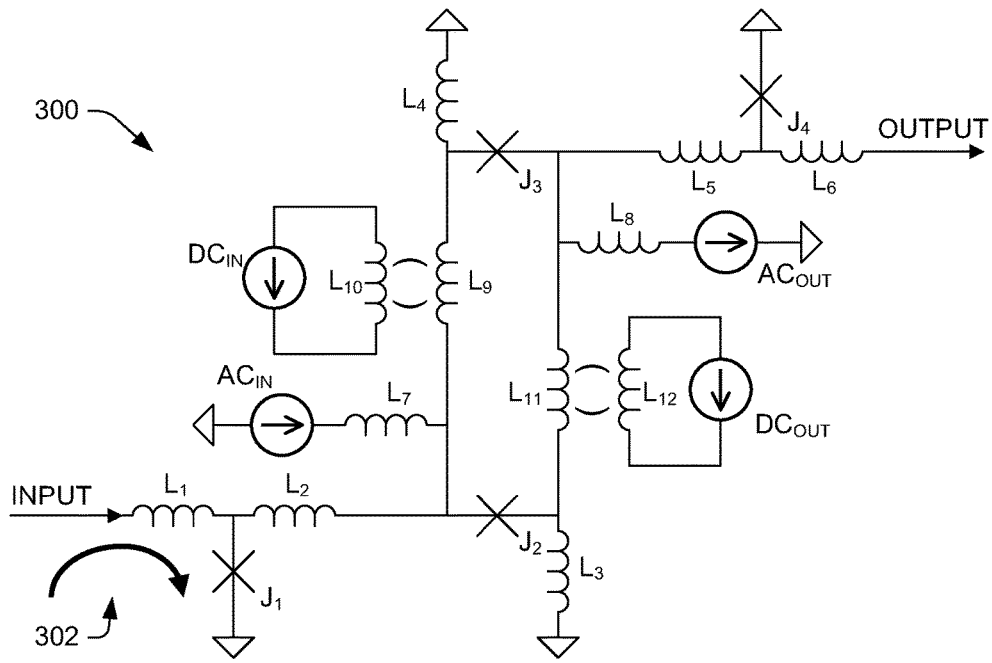
FIGS. 3C-3G are annotated schematics of the example Josephson polarity inverter gate of FIG. 3A showing an example functioning of the circuit.
Figure 3D:
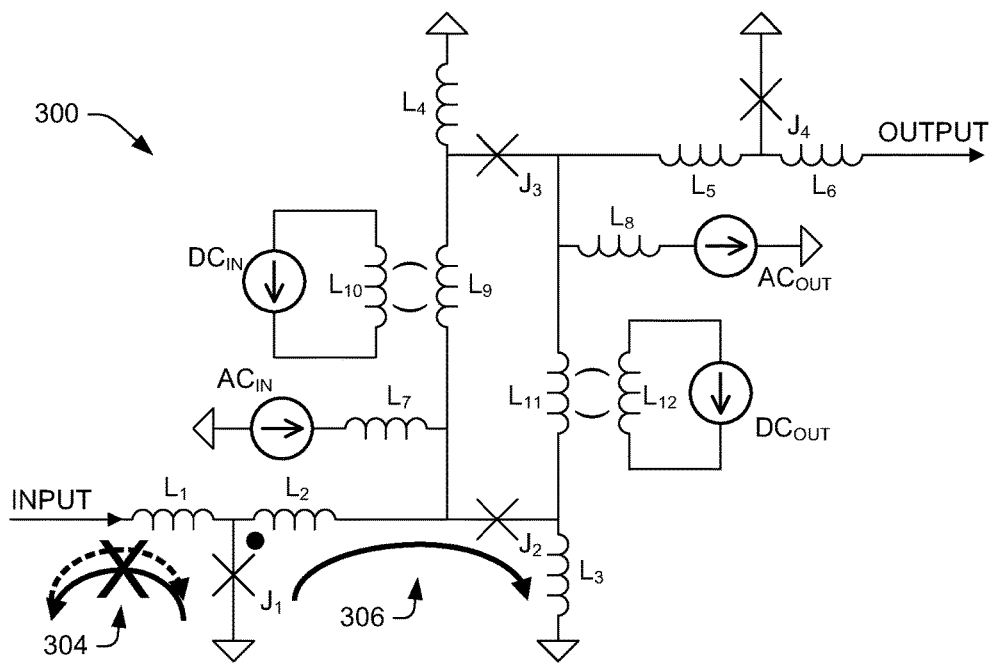
Figure 3E:
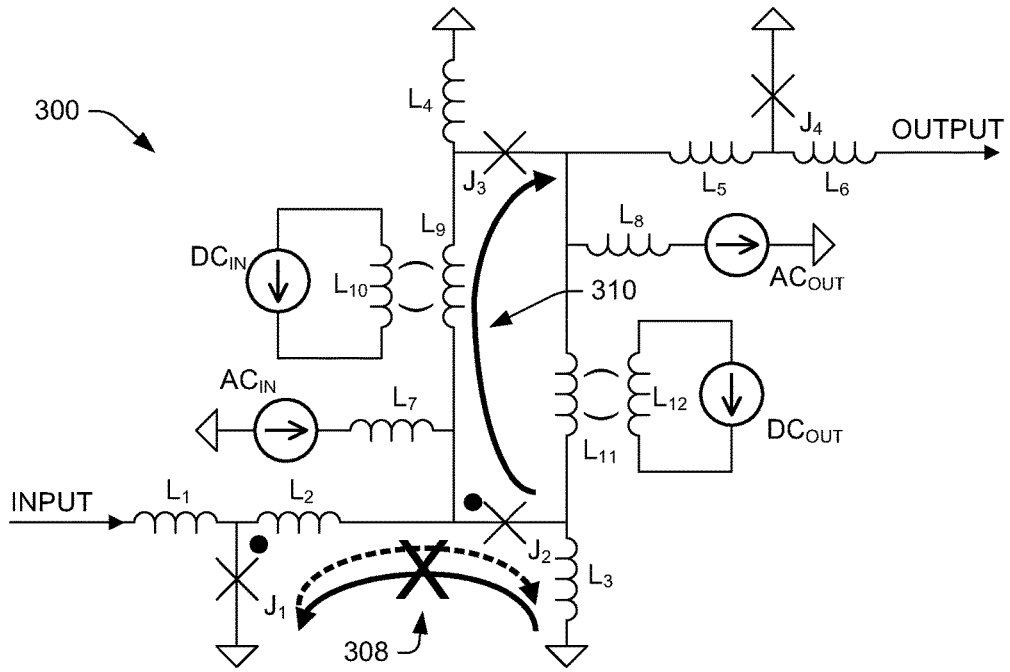
Figure 3F:
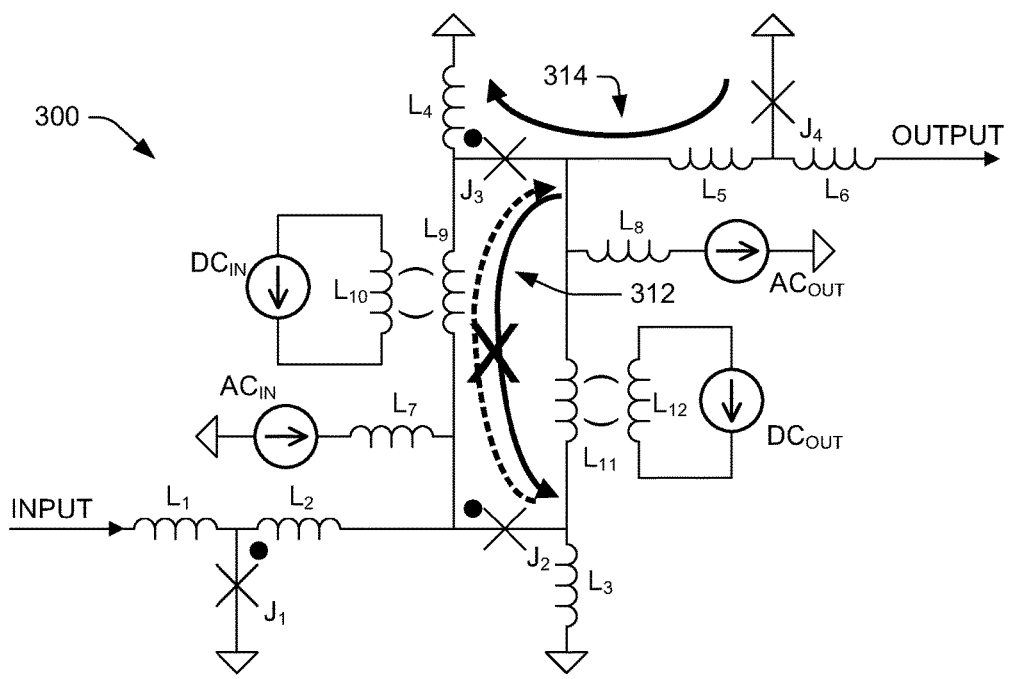
Figure 3G:
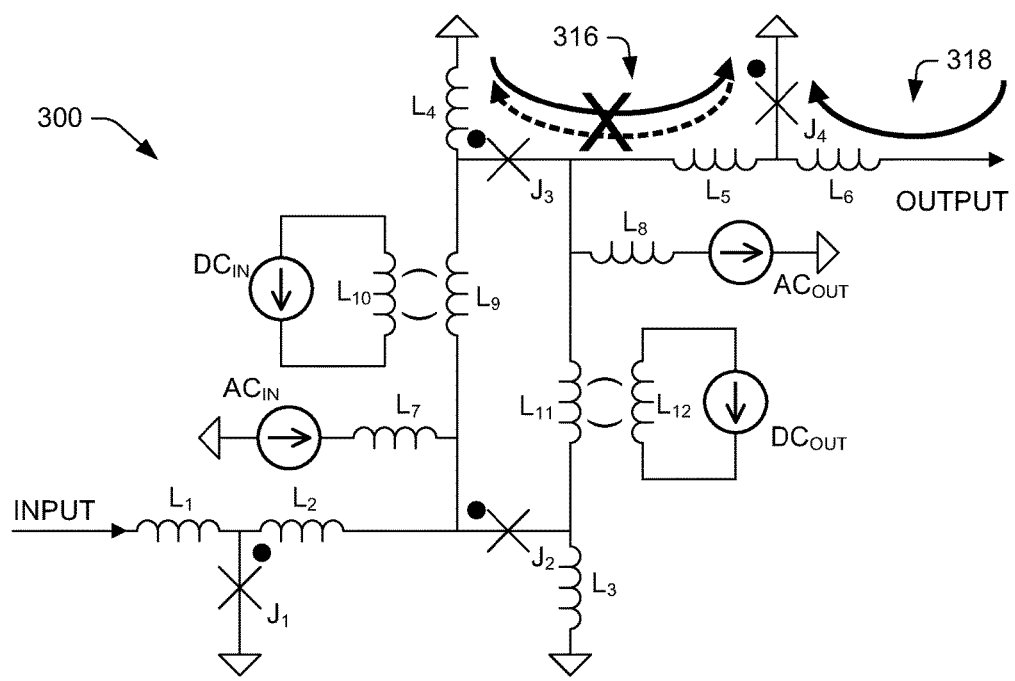

FIGS. 3C through 3G illustrate an example functioning of the polarity inverter circuit 300 of FIG. 3A. FIG. 3C shows a positive input pulse being introduced to the input of the polarity inverter 300 to cause current 302. This causes first Josephson junction $J_1$ to trigger, raising its superconducting phase from 0 to $2\pi$, as indicated with the dot placed above first Josephson junction $J_1$ in FIG. 3D. The triggering of first Josephson junction $J_1$ causes a functionally equal and opposite current 304 to annihilate the initial input pulse 302, and also propagates the initial pulse forward through the circuit 300 via current 306, which in turn causes second Josephson junction $J_2$ to trigger. As shown in FIG. 3E, the triggering of second Josephson junction $J_2$ results in an another annihilating current 308 and a propagating current 310, which causes third Josephson junction $J_3$ to trigger. FIG. 3F, shows this third triggering, annihilating current 310 with functionally equal and opposite current 312, and also causing propagating current 314. Finally, in the same fashion, fourth Josephson junction $J_4$ triggers, annihilating 316 current 314 and propagating a negative pulse 318 out of the output in FIG. 3G.

Thus it is that positive input pulse 302 results in negative output pulse 318. As noted by the dot on fourth Josephson junction $J_4$ at the far side of the signal propagation line in FIG. 3G, fourth Josephson junction $J_4$ is in a $-2\pi$ superconducting phase at the conclusion, consistent with the polarity inverter function illustrated in FIG. 3B. That is, the output is at $-2\pi$ when the input is at $2\pi$. In similar fashion, a subsequent negative pulse introduced to the input of circuit 300 will result in a positive pulse issuing from the output of circuit 300, and will return all Josephson junctions $J_1$-$J_4$ to the 0 superconducting phase.

Figure 4A:
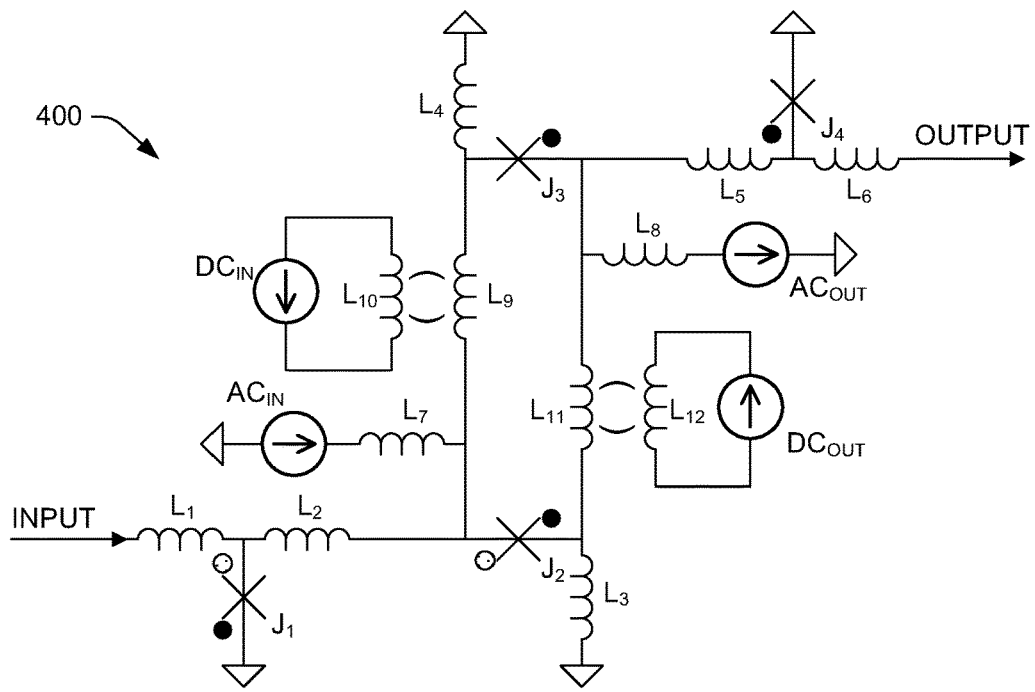
FIG. 4A is a schematic of an example Josephson logical inverter gate using a half-twisted JTL.
Figure 4B:
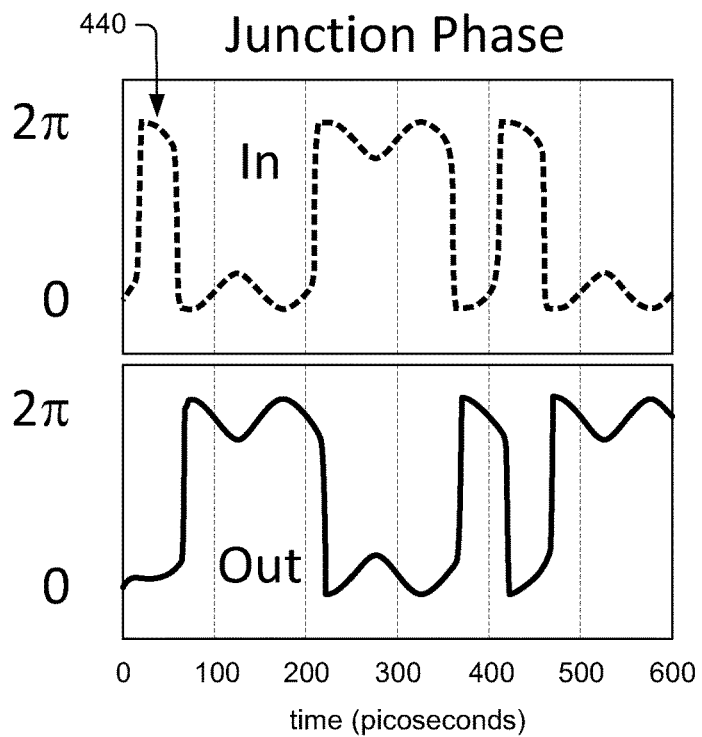
FIG. 4B is a graph of simulation results for the example gate of FIG. 4A.

FIG. 4A shows a schematic, with accompanying simulation result plots shown in FIG. 4B, of an RQL logical inverter with direct coupling. The logical inverter of FIG. 4A is similar to the polarity inverter 300 of FIG. 3A, except that the input and output can be initialized to opposite logical states, e.g., the input can be initialized to high. This initialization can be accomplished in part by reversing the polarity of one of the two DC flux biases, in the illustrated case, $DC_{OUT}$, as compared to circuit 300 of FIG. 3A.

As one example, at system start-up, an introductory positive input SFQ pulse can be introduced to the INPUT line, and shortly thereafter, before the input signal can propagate through the circuit 400 to the OUTPUT line, the $DC_{IN}$ and $DC_{OUT}$ biases are applied, together injecting one full $\Phi_0$ of current into the central loop that includes Josephson junctions $J_2$ and $J_3$. Absent the earlier introduction of the first positive input pulse, the injected central loop current could create an unstable state, because, as in any JTL, a Josephson junction in receipt of a $\Phi_0$ of current wants to pass it on, but it would be uncertain whether it would be passed back to the input (i.e., from second Josephson junction $J_2$ back to first Josephson junction $J_1$) or on to the output (i.e., from third Josephson junction $J_3$ to fourth Josephson junction $J_4$). By providing a first positive input SFQ pulse just before injecting the full $\Phi_0$ of current into the central loop, the positive input pulse is "eaten" (annihilated) by the functionally equal and opposite central loop current, retaining input-side Josephson junctions $J_1$ and $J_2$ in the $2\pi$ superconducting phase (e.g., a logical "high" state) without any change to the superconducting phase of the output-side Josephson junctions $J_3$ and $J_4$ from their initial 0 superconducting phase (e.g., a logical "low" state). Thus, the possibility of the initialization DC injection pulse being propagated to the output can be avoided by turning on the $DC_{IN}$ and $DC_{OUT}$ initialization currents timely after supplying the first input pulse to circuit 400.

The above-described initialization example, which is illustrated more fully in FIGS. 4C-4J, manifests in the plots of FIG. 4B as a transient 440 in the input Josephson junction phase triggered by the provision of the initial input signal (i.e., a positive SFQ pulse) in conjunction with the DC flux-bias turn-on, without any change to the output during the same time period. Later, when a subsequent negative SFQ pulse is provided to the input (around the 50 picosecond mark), the output goes to logical "high" for the first time. The transient $2\pi$ superconducting phases of input-side Josephson junctions $J_1$ and $J_2$ during initialization are illustrated in FIG. 4A by stipple-filled superconducting phase dots at Josephson junctions $J_1$ and $J_2$. The transition (at about the 50 picosecond mark) from high to low on the input and from low to high on the output is indicated by the solid dots near Josephson junctions $J_1$ and $J_2$ in FIG. 4A. Although these dots are placed on the opposite side of the Josephson junctions from the stipple-filled superconducting phase dots, they are meant only to indicate a return to 0 superconducting phase and not that the Josephson junctions have transitioned to a $-2\pi$ superconducting phase.

Upon the introduction of a positive pulse to the input (at around the 200 picosecond mark), raising the input Josephson junction superconducting phase from 0 to $2\pi$, the output Josephson junction superconducting phase falls from $2\pi$ to 0 after some short propagation time. A negative pulse at the input (at around the 350 picosecond mark) causes the input Josephson junction superconducting phase to fall from $2\pi$ to 0 and, conversely, the output Josephson junction superconducting phase to rise from 0 to $2\pi$. A second positive pulse introduced to the input (at around the 400 picosecond mark) causes the input Josephson junction superconducting phase to again rise from 0 to $2\pi$ and, conversely, the output Josephson junction superconducting phase to again fall from $2\pi$ to 0. A second negative pulse arriving at the input (at around the 450 picosecond mark) causes the input Josephson junction superconducting phase to again fall from $2\pi$ to 0 and, conversely, the output Josephson junction superconducting phase to again rise to $2\pi$ from 0. The plots of FIG. 4B thus accurately characterize the behavior of the logical inverter 400 of FIG. 4A.

As another initialization example for the circuit of FIG. 4A, not illustrated in FIG. 4B, an introductory negative SFQ pulse can be introduced via the OUTPUT line at system start-up, and shortly thereafter, before the signal can propagate through the circuit 400 to the INPUT line, the $DC_{IN}$ and $DC_{OUT}$ biases are applied, together injecting one full $\Phi_0$ of current into the central loop that includes Josephson junctions $J_2$ and $J_3$. The negative pulse is "eaten" (annihilated) by the functionally equal and opposite central loop current, retaining output-side Josephson junctions $J_3$ and $J_4$ in the $2\pi$ superconducting phase (e.g., a logical "high" state) without any change to the superconducting phase of the input-side Josephson junctions $J_1$ and $J_2$ from their initial 0 superconducting phase (e.g., a logical "low" state). This initialization example is illustrated more fully in FIGS. 4K-4R. In either initialization example, the DC biases can be applied before or after the initializing pulses are applied.

Figure 4C:
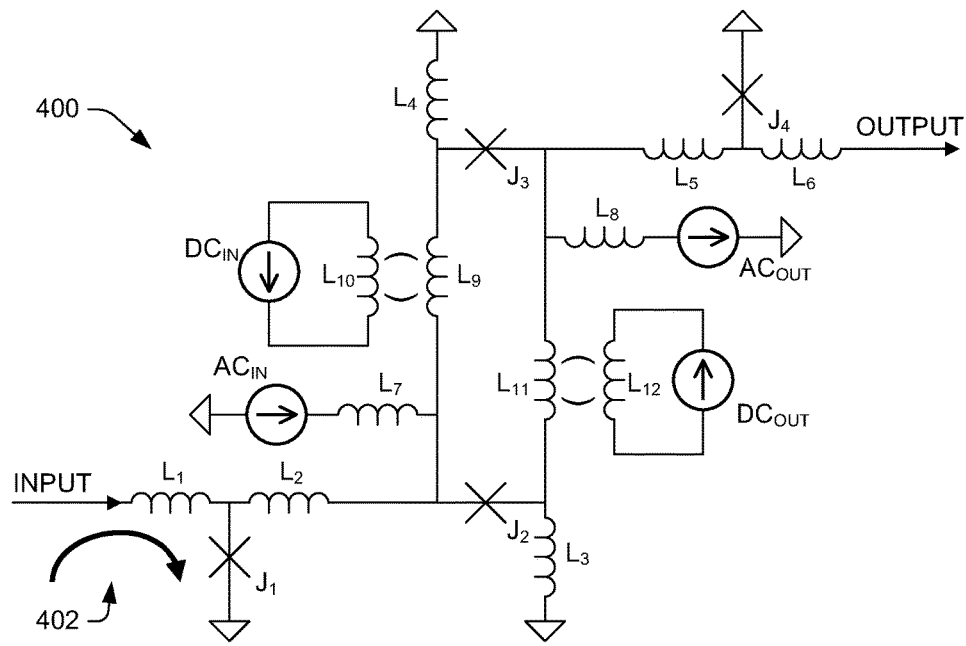
FIGS. 4C-4J are annotated schematics of the example Josephson logical inverter gate of FIG. 4A showing a first example functioning of the circuit.
Figure 4D:
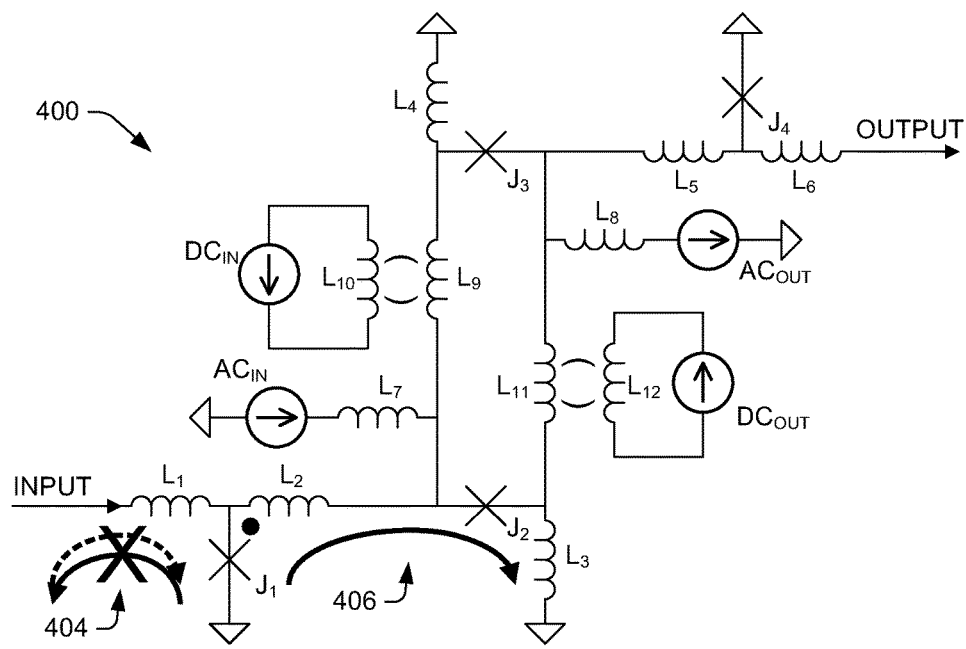
Figure 4E:
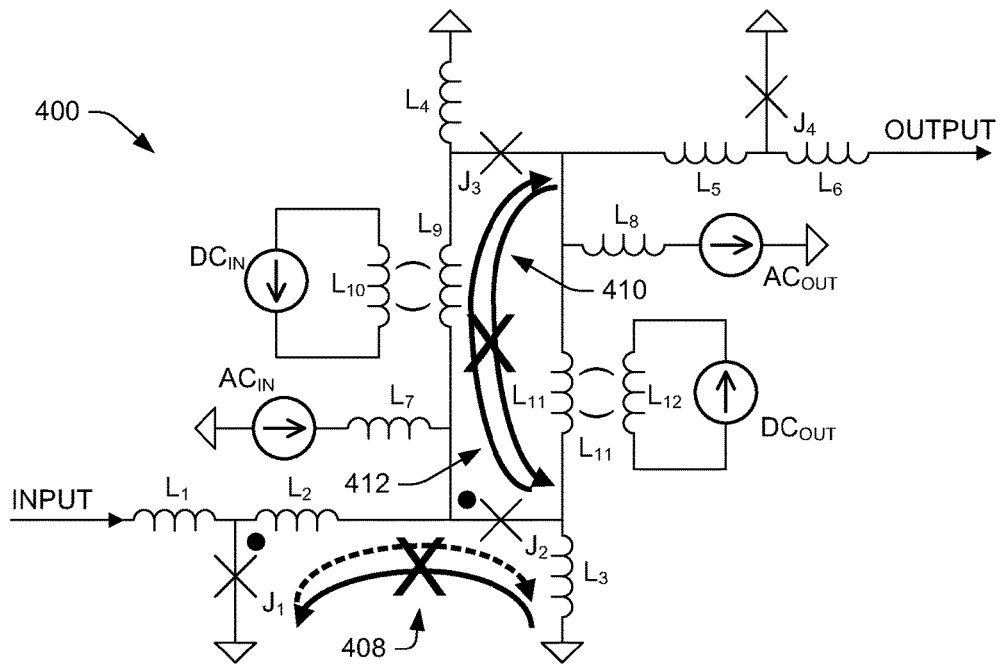

FIGS. 4C through 4J illustrate the first-described example functioning of the logical inverter circuit 400 of FIG. 4A, wherein an initializing pulse is provided through the INPUT and "eaten" in the central loop. FIG. 4C shows a positive input pulse being introduced to the INPUT of the logical inverter 400 to cause current 402. This causes first Josephson junction $J_1$ to trigger, raising its superconducting phase from 0 to $2\pi$, as indicated with the dot placed above first Josephson junction $J_1$ in FIG. 4D. The triggering of first Josephson junction $J_1$ causes a functionally equal and opposite current 404 to annihilate the initial current 402, and also propagates the initial pulse forward through the circuit 400 via current 406, which in turn causes second Josephson junction $J_2$ to trigger. As shown in FIG. 4E, the triggering of second Josephson junction $J_2$ results in another annihilating current 408 and a propagating current 412.

In contrast, however, to the functioning of polarity inverter 300 of FIG. 3A, before the propagating current 412 can propagate on through the circuit, a functionally equal and opposite current 410 is induced in the central loop of circuit 400 by DC current sources $DC_{IN}$ and $DC_{OUT}$, annihilating current 412 before it can cause third Josephson junction $J_3$ to trigger. The superconducting phase of fourth Josephson junction $J_4$ thus stays at 0 despite the superconducting phase of first Josephson junction $J_1$ being at $2\pi$. As mentioned previously, as an alternative, DC-source-induced central loop current 410 can be introduced prior to the input of initializing current 402.

Figure 4F:
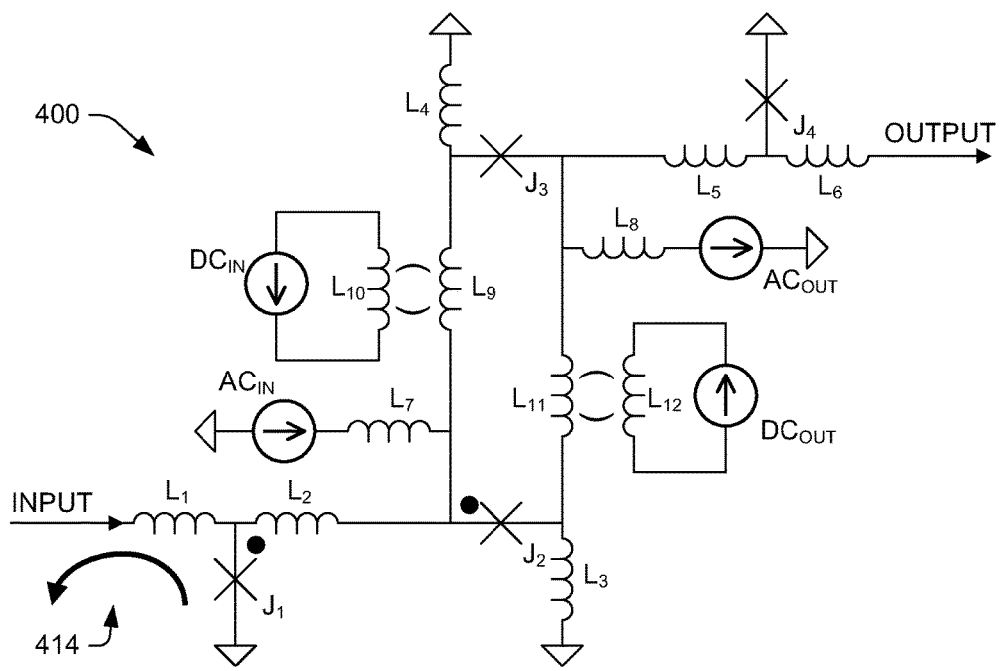
Figure 4G:
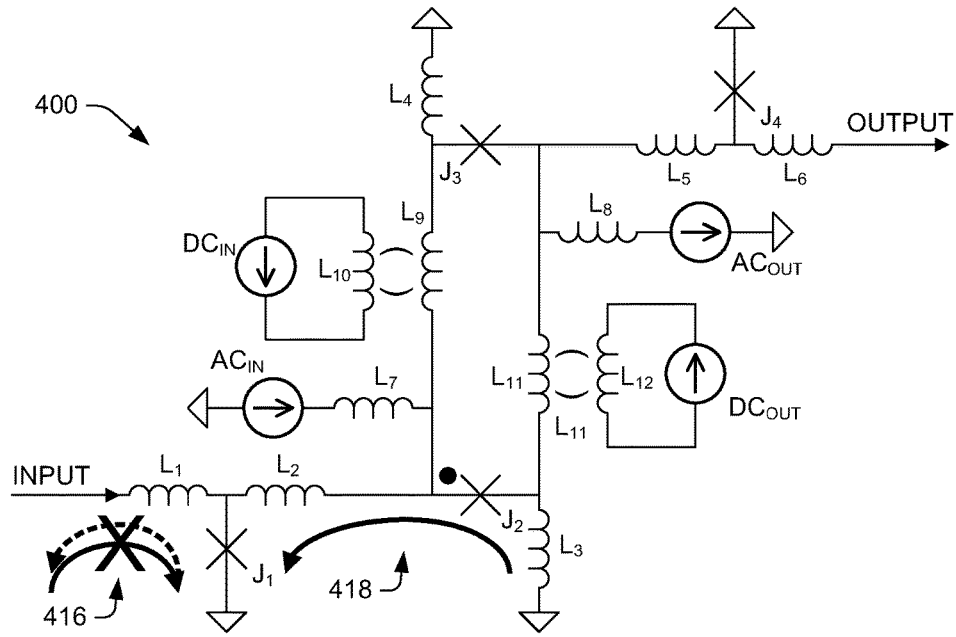
Figure 4H:
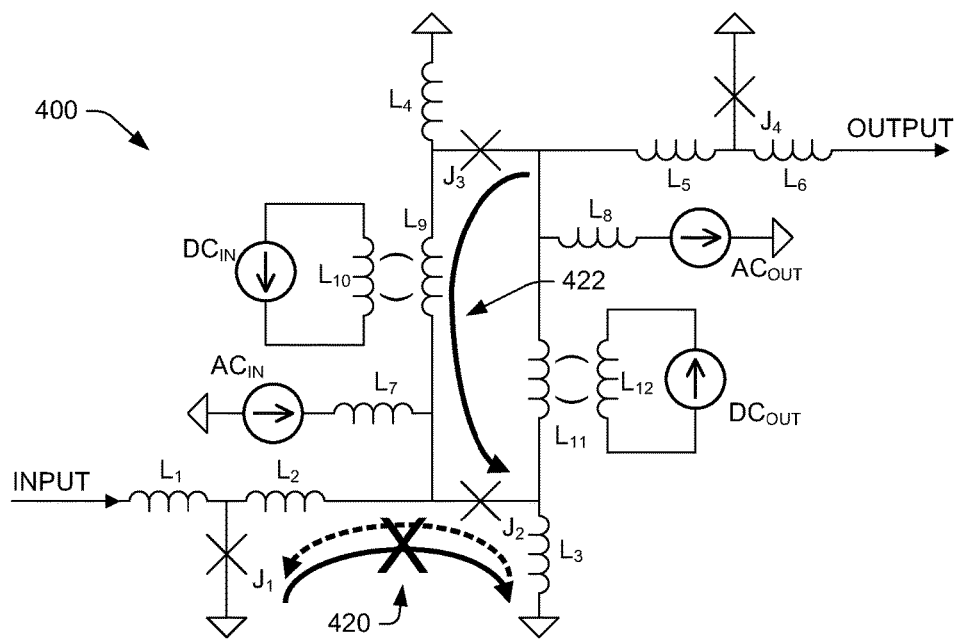

Following from FIG. 4E, FIG. 4F shows the subsequent introduction of a negative input pulse applied to the INPUT of circuit 400 to induce current 414. Thus, in FIG. 4G, first Josephson junction $J_1$ untriggers, annihilating current 414 with functionally equal and opposite current 416. The negative input pulse propagates via negative current 418, which causes second Josephson junction $J_2$ to untrigger, as shown in FIG. 4H. Concomitantly, annihilating current 420 and propagating current 422 are produced by the untriggering of second Josephson junction $J_2$, and at this point both first and second Josephson junctions $J_1$ and $J_2$ again exhibit the initial superconducting phase of 0.

Figure 4I:
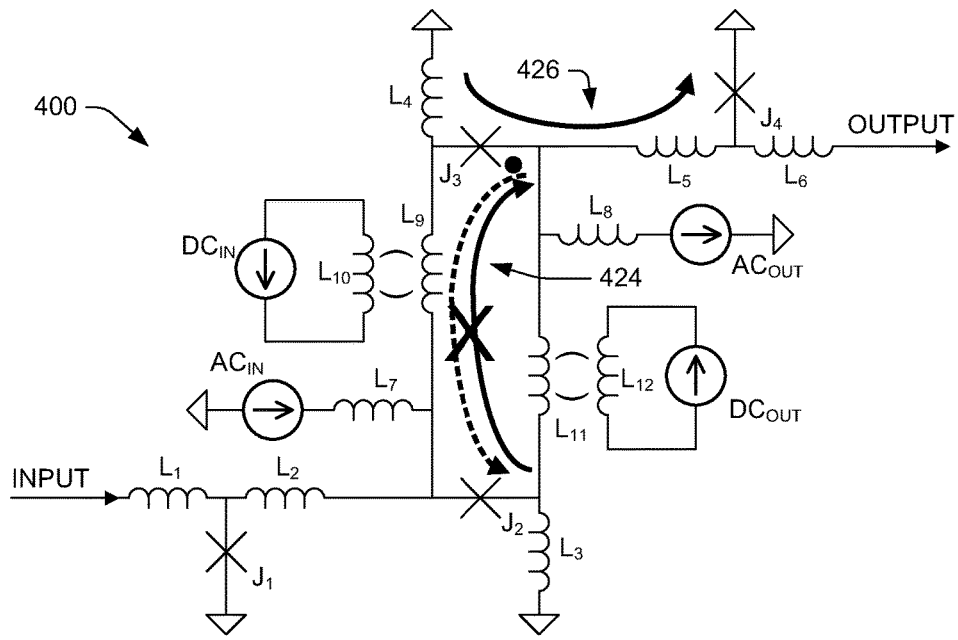
Figure 4J:
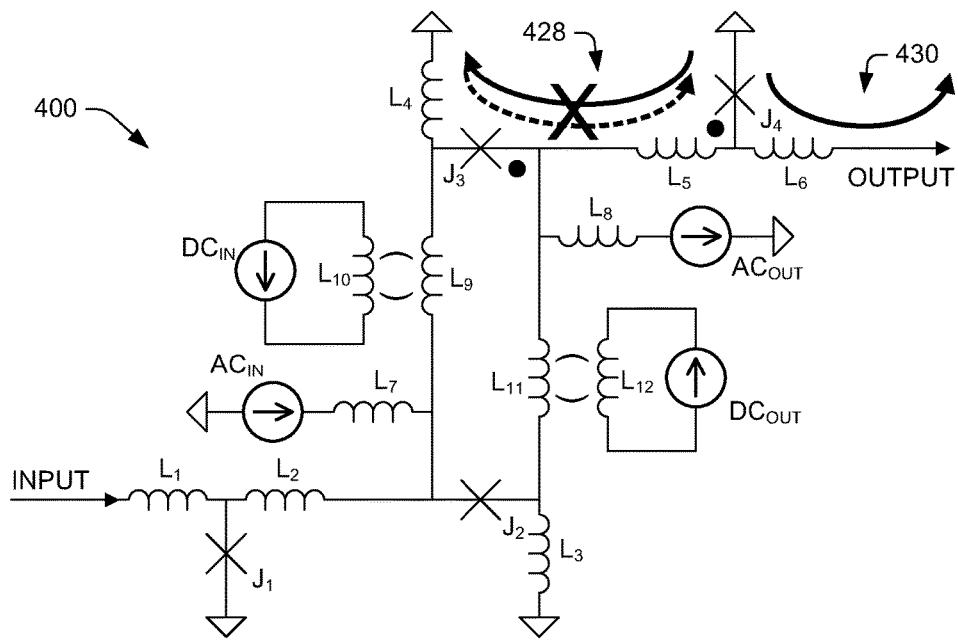

The untriggering of second Josephson $J_2$ and propagation of negative pulse 422 through the central loop of circuit 400 then cause third Josephson junction $J_3$ to trigger, as shown in FIG. 4I, annihilating current 422 with functionally equal and opposite current 424, and also causing propagating current 426. Comparing FIG. 4I with FIG. 3F, that third Josephson junction $J_3$ has triggered in the opposite direction in the logical inverter configuration 400 as compared to the polarity inverter configuration 300, and thus, as shown by the relative placement of the dots around third Josephson junction $J_3$ in the respective drawings, third Josephson junction $J_3$ has obtained a $2\pi$ superconducting phase in FIG. 4I as compared to the $-2\pi$ superconducting phase obtained in FIG. 3F. Finally, in the same fashion, fourth Josephson junction $J_4$ triggers to obtain a $2\pi$ superconducting phase of its own, annihilating 428 current 426 and propagating a positive pulse via current 430 out of the OUTPUT in FIG. 4J.

Thus it is that negative input pulse 414 results in positive output pulse 430. Moreover, as noted by the dot on fourth Josephson junction $J_4$ at the near side the signal propagation line in FIG. 4J, fourth Josephson junction $J_4$ is in a $2\pi$ superconducting phase at the conclusion of this sequence, which corresponds to the end of transient 440 illustrated in FIG. 4B. The above-described functioning is consistent with the polarity inverter function illustrated in FIG. 4B. That is, the output is at $2\pi$ when the input is at 0. In similar fashion, a subsequent positive pulse introduced to the INPUT of circuit 400 will result in a negative pulse issuing from the OUTPUT of circuit 400, and will place Josephson junctions $J_1$ and $J_2$ in a $2\pi$ superconducting phase and will return Josephson junctions $J_3$ and $J_4$ to a 0 superconducting phase, again consistent with FIG. 4B and the desired polarity inverter function.

Figure 4K:
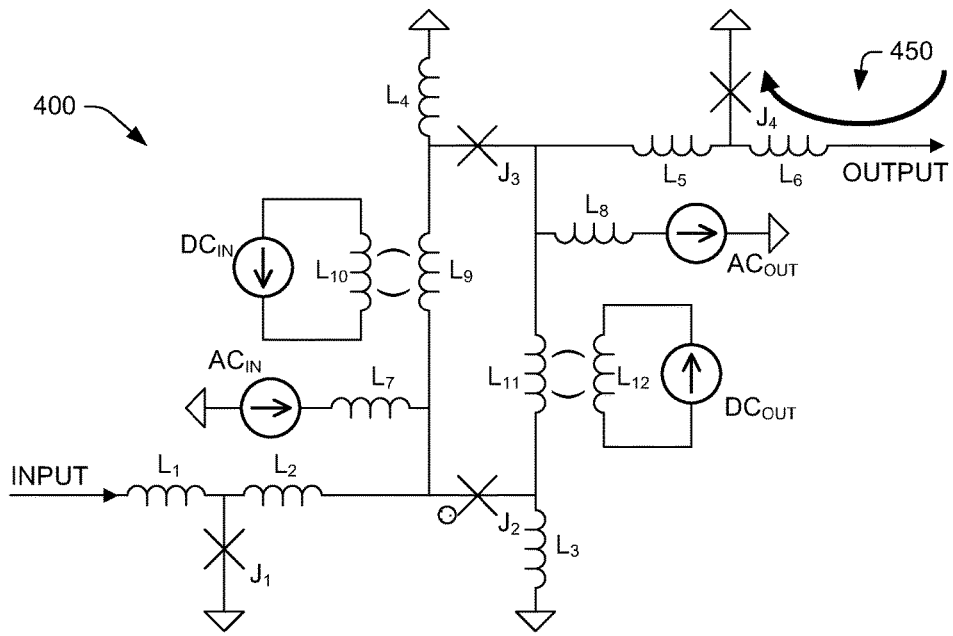
FIGS. 4K-4R are annotated schematics of the example Josephson logical inverter gate of FIG. 4A showing a second example functioning of the circuit.
Figure 4L:
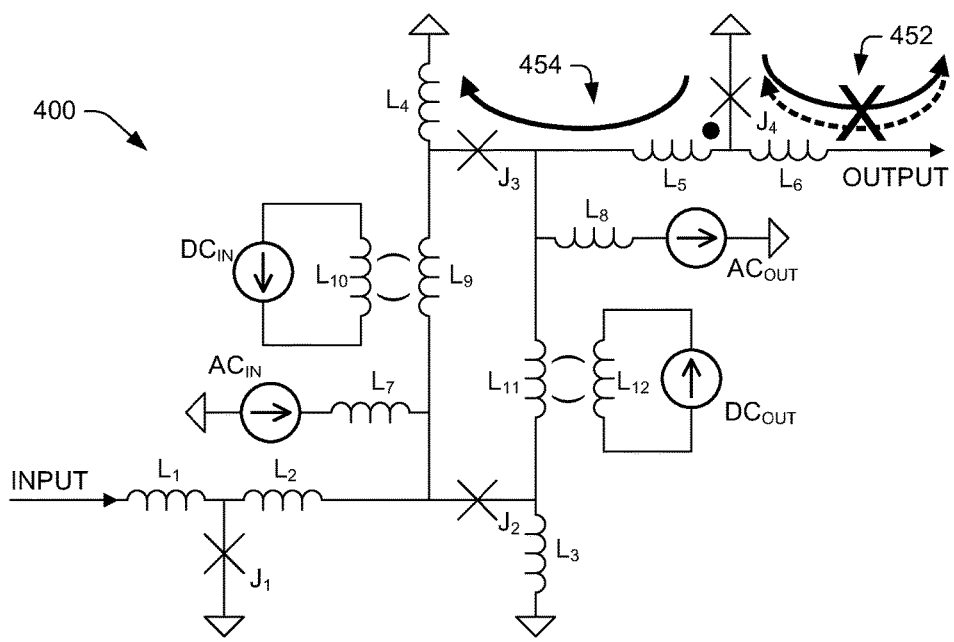
Figure 4M:
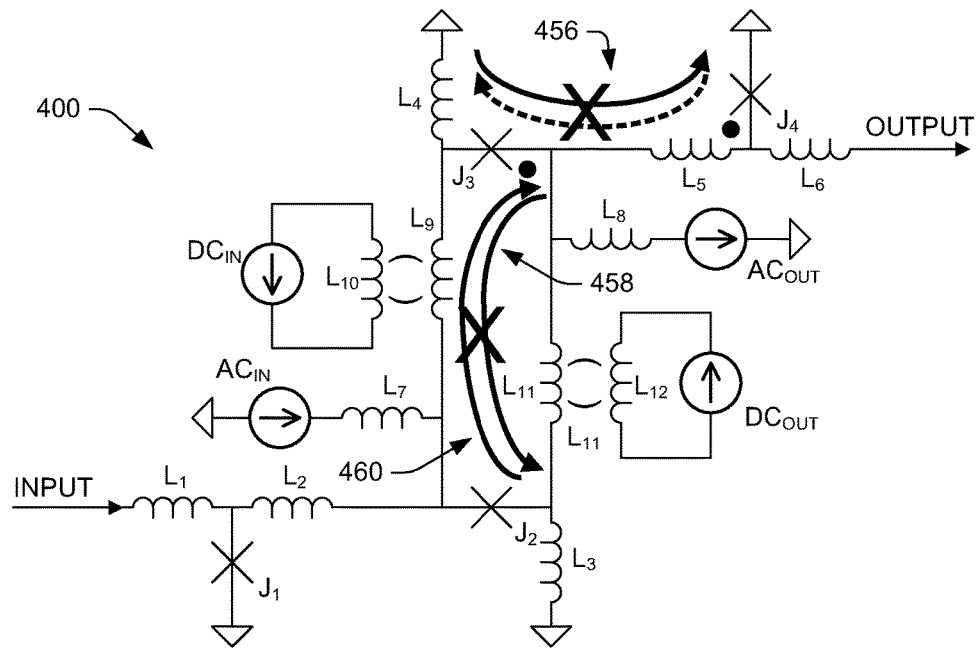

FIGS. 4K through 4R illustrate the second-described example functioning of the logical inverter circuit 400 of FIG. 4A, wherein an initializing pulse is provided through the OUTPUT and "eaten" in the central loop. From an initial state, FIG. 4K shows a negative pulse being introduced to the OUTPUT of the logical inverter 400 to induce current 450. This causes fourth Josephson junction $J_4$ to trigger, raising its superconducting phase from 0 to $2\pi$, as indicated with the dot placed below fourth Josephson junction $J_4$ in FIG. 4L. The triggering of fourth Josephson junction $J_4$ causes a functionally equal and opposite current 452 to annihilate the initial input current 450, and also propagates the initial pulse backward through the circuit 400 via current 454, which in turn causes third Josephson junction $J_3$ to trigger. As shown in FIG. 4M, the triggering of third Josephson junction $J_3$ results in another annihilating current 456 and a propagating current 460.

Similarly to the previously described functioning and as shown earlier in FIG. 4E, current 460 is not permitted to propagate further but is "eaten" in the central loop of circuit 400 by a functionally equal and opposite current 458 induced in the central loop by of circuit 400 by DC current sources $DC_{IN}$ and $DC_{OUT}$. The superconducting phase of second Josephson junction $J_2$ thus stays at 0 despite the superconducting phase of fourth Josephson junction $J_4$ being at $2\pi$.

Figure 4N:
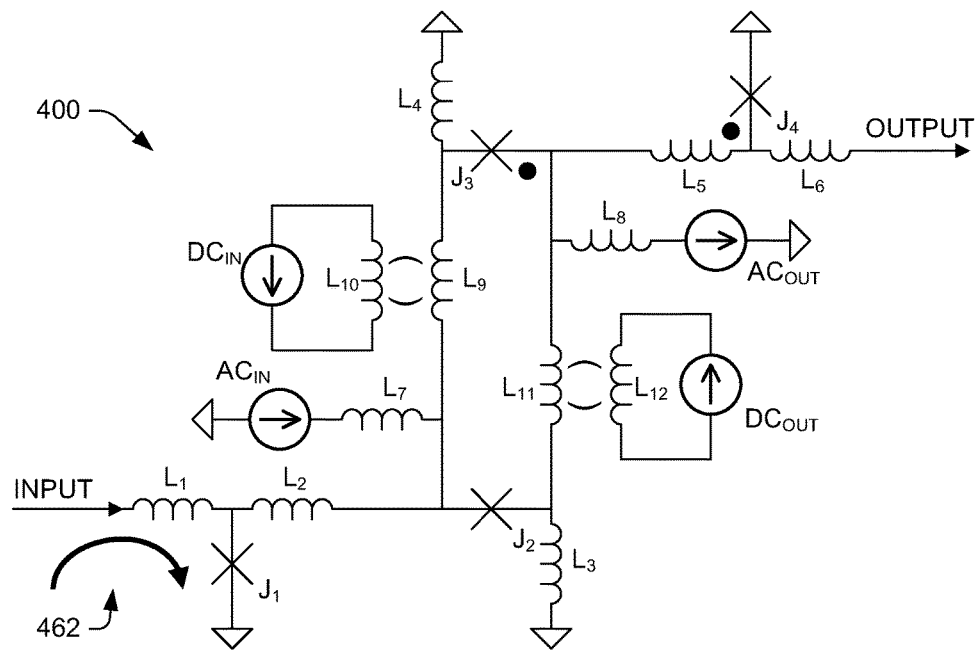
Figure 4O:
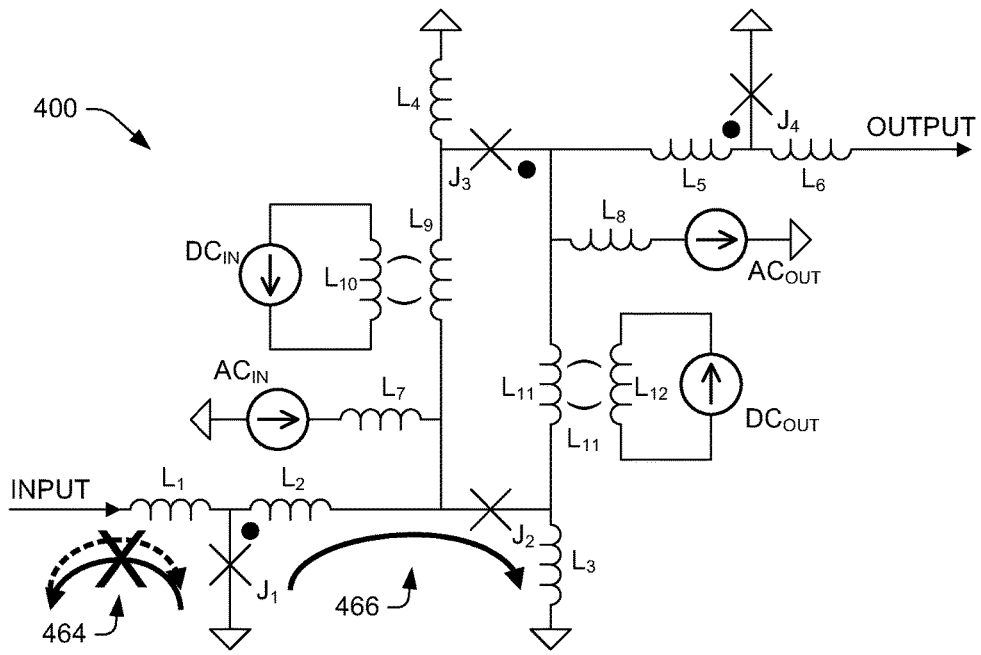
Figure 4P:
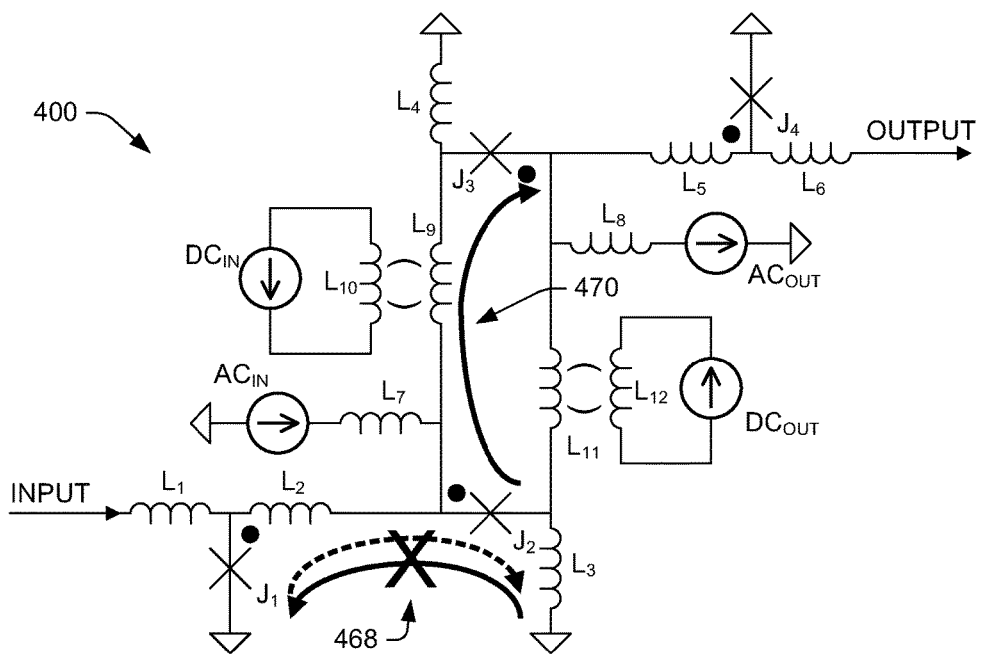

Following from FIG. 4M, FIG. 4N shows the subsequent introduction of a positive input pulse applied to the INPUT of circuit 400 to induce current 462. Thus, in FIG. 4O, first Josephson junction $J_1$ triggers, annihilating current 462 with functionally equal and opposite current 464. The positive input pulse propagates via positive current 466, which causes second Josephson junction $J_2$ to trigger, as shown in FIG. 4P. Concomitantly, annihilating current 468 and propagating current 470 are produced by the triggering of second Josephson junction $J_2$, and at this point all four Josephson junctions $J_1$-$J_4$ exhibit the $2\pi$ superconducting phase.

Figure 4Q:
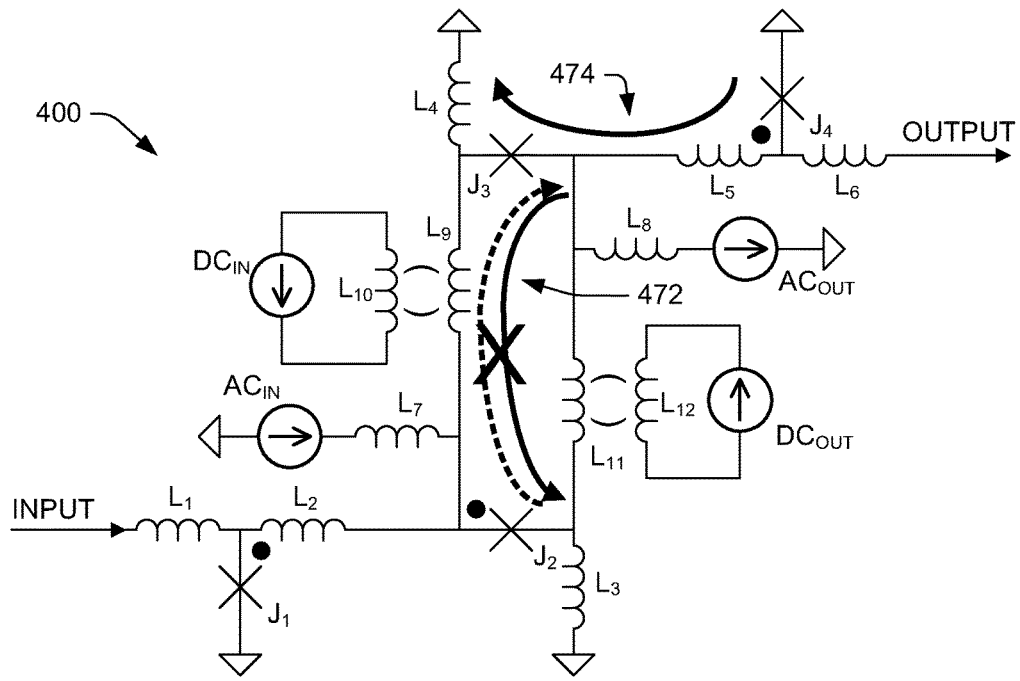
Figure 4R:
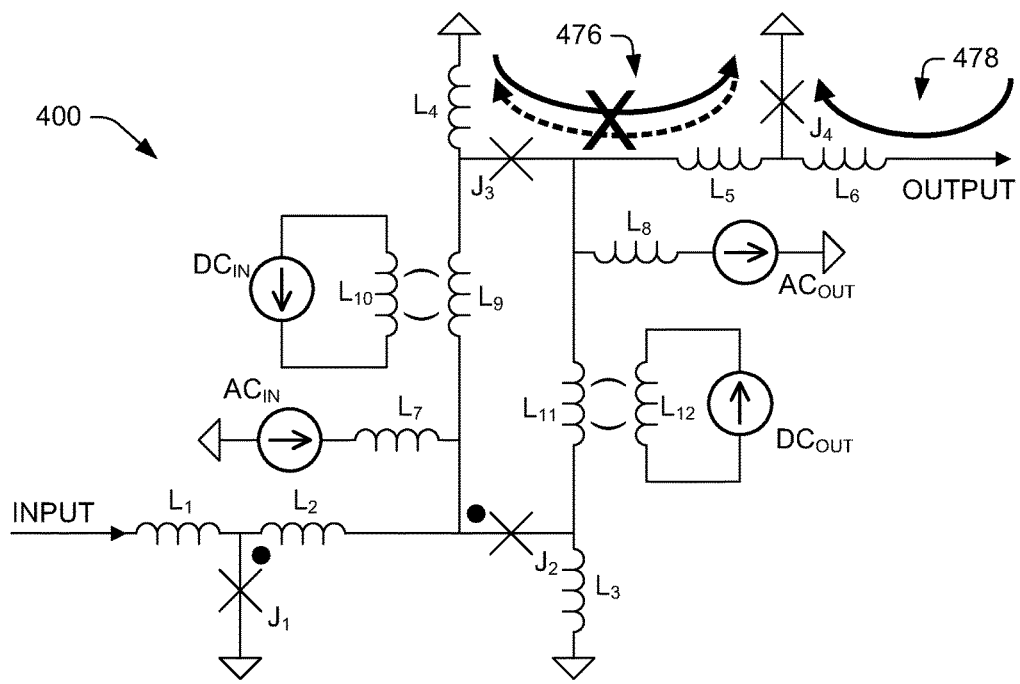

The triggering of second Josephson $J_2$ and propagation of positive pulse 470 through the central loop of circuit 400 then cause third Josephson junction $J_3$ to untrigger, as shown in FIG. 4Q, annihilating current 470 with functionally equal and opposite current 472, and also causing propagating current 474. Comparing FIG. 4Q with FIG. 4I, third Josephson junction $J_3$ has triggered in the opposite direction by this sequence of operation (illustrated in FIGS. 4K-4R) as compared to the previously described sequence of operation (illustrated in FIGS. 4C-4J), and thus, as shown by the relative placement of the dots around third Josephson junction $J_3$ in the respective drawings, Josephson junction $J_3$ exhibits a 0 superconducting phase in FIG. 4Q as compared to the $2\pi$ superconducting phase exhibited in FIG. 4I. Finally, in the same fashion, fourth Josephson junction $J_4$ untriggers to exhibit a 0 superconducting phase of its own, annihilating 476 current 474 and propagating a negative pulse 478 out of the OUTPUT of logical inverter circuit 400 in FIG. 4R.

Thus it is that positive input pulse 462 results in negative output pulse 478. Moreover, as noted by the absence of any dot near fourth Josephson junction $J_4$ in FIG. 4R, fourth Josephson junction $J_4$ is in a 0 superconducting phase at the conclusion of this sequence. The above-described functioning is consistent with the desired polarity inverter function. That is, the output is at 0 when the input is at $2\pi$. In similar fashion, a subsequent negative pulse introduced to the INPUT of circuit 400 will result in a positive pulse issuing from the OUTPUT of circuit 400, and will return Josephson junctions $J_1$ and $J_2$ to a 0 superconducting phase and will place Josephson junctions $J_3$ and $J_4$ in a $2\pi$ superconducting phase, again consistent with the desired polarity inverter function.

Figure 5:
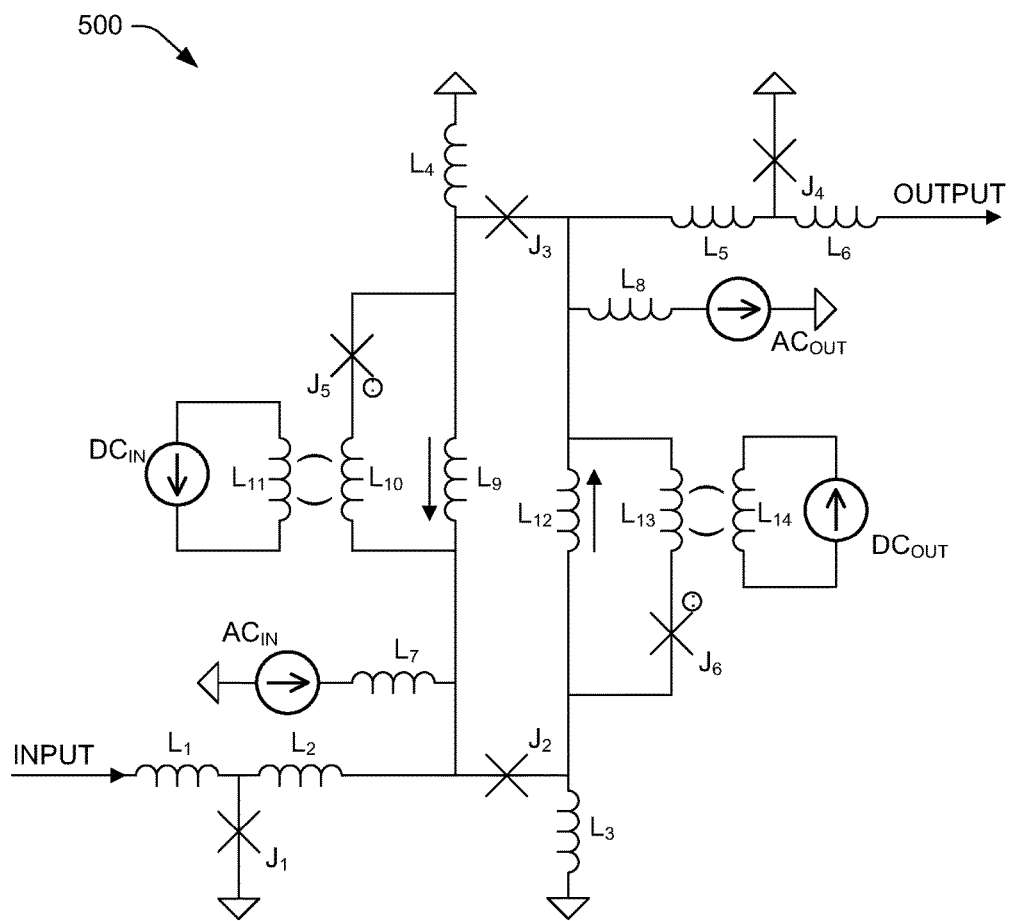
FIG. 5 is a schematic of an example Josephson logical inverter gate using a half-twisted JTL and direct coupling.

FIG. 5 shows an example schematic of an RQL logical inverter 500 with direct coupling that has the implantation of the flux bias using an extra junction on each side, i.e., Josephson junctions $J_5$ and $J_6$. This implementation may also be referred to as a "digital flux bias" implementation. In this configuration 500, the biases $DC_{IN}$ and $DC_{OUT}$ trigger respective $2\pi$ phase advances in Josephson junctions $J_5$ and $J_6$. On the left side of the central loop of circuit 500, when the inductances in the $L_9$ branch and the $J_5/L_{10}$ branch are similar, then the desired $\Phi_0/2$ flux bias obtains with reduced sensitivity to the value of $DC_{IN}$. Similarly, on the right side of the central loop of circuit 500, when the inductances in the $L_{12}$ branch and the $J_6/L_{13}$ branch are similar, then the desired $\Phi_0/2$ flux bias obtains with reduced sensitivity to the value of $DC_{OUT}$. Circuit 500 otherwise operates similarly to the previously described logical inverter 400 of FIG. 4A and the opposing superconducting phases in the input Josephson junctions $J_1$, $J_2$ versus the output Josephson junctions $J_3$, $J_4$ can be achieved in circuit 500 as already described with respect to circuit 400 in order to achieve the desired logical inversion functionality.

Figure 6:
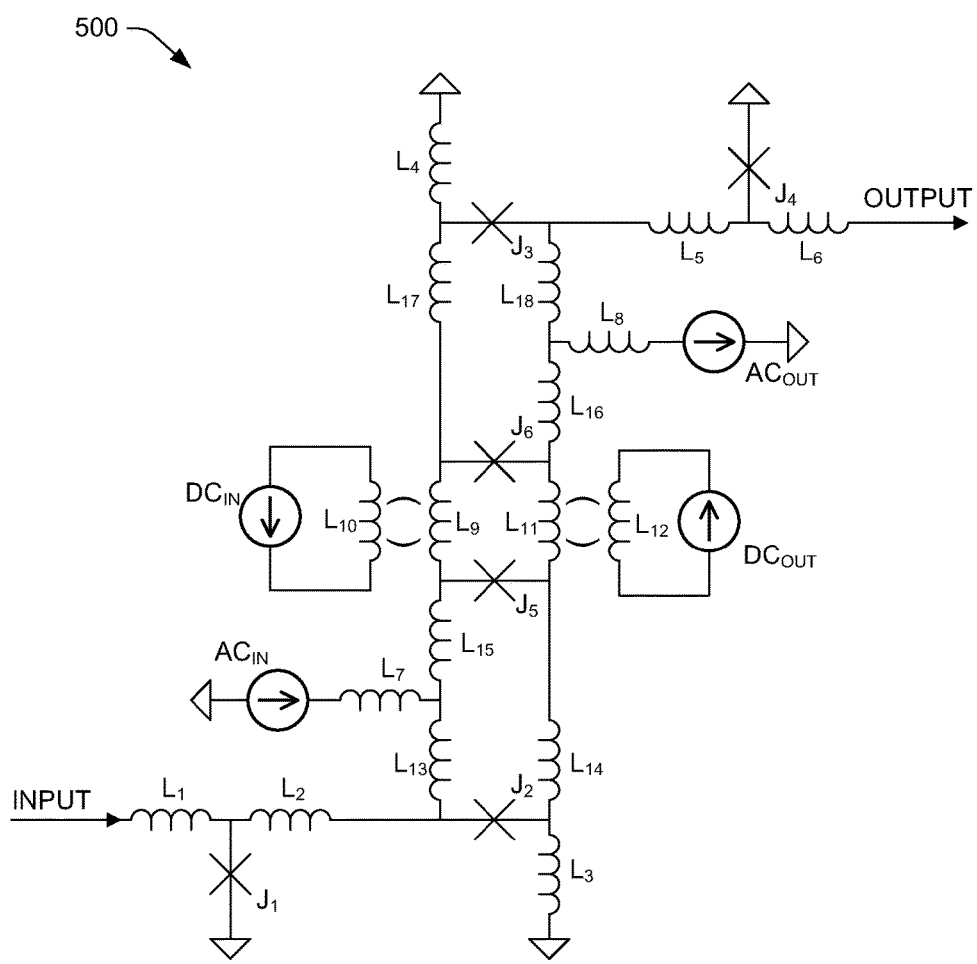
FIG. 6 is a schematic of another example Josephson logical inverter gate using a half-twisted JTL.

FIG. 6 shows an example schematic of an RQL logical inverter 600 that produces higher output drive as compared to the previously described examples. The input and output are more isolated with respect to ground as compared to the previous examples, but with the tradeoff that inverter 600 has a higher component count as compared to the previous examples. Circuit 600 otherwise operates similarly to the previously described logical inverter 400 of FIG. 4A and the opposing superconducting phases in the input Josephson junctions $J_1$, $J_2$ versus the output Josephson junctions $J_3$, $J_4$ can be achieved in circuit 600 as already described with respect to circuit 400 in order to achieve the desired logical inversion functionality.

FIG. 7 is a schematic of an example RQL polarity inverter circuit 700 that uses a single floating junction $J_F$ that produces two SFQ pulses when triggered, which then triggers the output with negative polarity, i.e., such that output Josephson junction $J_4$ exhibits $-2\pi$ superconducting phase after a positive input signal brings input Josephson junction $J_1$ to $2\pi$ superconducting phase. Similarly, FIG. 8 is a schematic of an example RQL logical inverter circuit 800 that operates in a similar fashion, except that output Josephson junction $J_4$ exhibits $2\pi$ superconducting phase after a negative input signal brings input Josephson junction $J_1$ to 0 superconducting phase. Thus, circuits 700 and 800 do not rely on the half-twisted JTL structure conceptually illustrated in FIG. 2. Logical inverter of FIG. 8 can function irrespective of the direction of the DC current source in the middle of circuit provided through transformer coupling $L_{10}/L_9$, so it is actually the polarity of a DC offset associated with $AC_{OUT}$ that distinguishes logical inverter 800 from polarity inverter 700. In polarity inverter 700, said DC offset is $-\Phi_0/2$, whereas in logical inverter 800, said DC offset is $+\Phi_0/2$. This negative DC offset in $AC_{OUT}$ in the polarity inverter 700 is so that the first transition on the OUTPUT of circuit 700 is negative (from 0 to $-2\pi$). In either circuit 700 or 800, $AC_{IN}$ has a DC offset of $+\Phi_0/2$.

The operation of floating Josephson junction $J_F$ in circuits 700 and 800 can be described with reference to the pendulum mechanical analogy for the Josephson junction device. The equations of motion of a Josephson junction are isomorphic to those of a physical pendulum suspended at a central swinging point, and with nothing to prevent the pendulum from swinging all the way around this central swinging point once or even multiple times. In the analogy, superconducting phase in the Josephson junction can be likened to mechanical phase of the pendulum; current in the Josephson junction is equivalent to torque in the pendulum; voltage on the Josephson junction is analogous to angular velocity on the pendulum; and the inductors associated with the Josephson junction in a circuit would be torsion springs in the analogy.

A Josephson junction, like a pendulum, can function as an oscillator. In many circuit implementations, a Josephson junction is provided with a damping resistor so that it is close to critically damped. The Josephson junction then does not swing back and forth like a pendulum in a grandfather clock, but instead, when made to trigger, goes "all the way over the top," does a $2\pi$ superconducting phase rotation, and then settles. If underdamped, by, for example, increasing the value of the damping resistor or removing said resistor completely (i.e., to create an open circuit), then upon triggering, the underdamped Josephson junction may roll around "over the top" and begin oscillating like a grandfather clock, and may even roll over twice, i.e., to the $4\pi$ superconducting phase.

With reference to FIG. 7, the introduction of a positive SFQ pulse on the INPUT line triggers the first Josephson junction $J_1$, which subsequently triggers the second Josephson junction $J_2$, which in turn triggers floating Josephson junction $J_F$. Floating Josephson junction $J_F$ is arranged so as to be underdamped, like a pendulum that rolls over once and then once again, e.g., by configuring the Josephson junction to be without its shunt resistor, and by configuring the flux bias provided by the DC current source in the middle of circuit 700 to inject $+\Phi_0/2$ of current into floating Josephson junction $J_F$, i.e., into the central loop formed by second Josephson junction $J_2$, floating Josephson junction $J_F$, inductor $L_5$, and third Josephson junction $J_3$. When floating Josephson junction $J_F$ triggers the first time, the current in the central loop goes to $-\Phi_0/2$, putting floating Josephson junction $J_F$ in a different potential well without "loading" it—floating Josephson junction $J_F$ remains at the same energy level where it started.

Therefore, the "momentum" of floating Josephson junction $J_F$ is able to carry it "over the top" a second time, i.e., to a $4\pi$ superconducting phase, as indicated by the double dots near floating Josephson junction $J_F$ in FIG. 7. The resultant state is not stable, and floating Josephson junction $J_F$ negatively triggers. The resultant negative pulse propagates through the circuit 700, such that the positive input pulse and $2\pi$ superconducting phase at input-side Josephson junctions $J_1$ and $J_2$ result in output-side Josephson junctions $J_3$ and $J_4$ being in a $-2\pi$ superconducting phase, and a negative pulse propagating out the OUTPUT line. As illustrated in FIG. 7, output AC bias signal $AC_{OUT}$ is configured to be functionally if not exactly opposite in polarity (e.g., 180° different in AC phase) from the input AC bias signal $AC_{IN}$.

Logical inverter 800 of FIG. 8 works similarly to polarity inverter 700 of FIG. 8, leveraging floating Josephson junction $J_F$ to provide inversion, except that, just as with the logical inverter circuit 400 of FIG. 4A as compared to the polarity inverter circuit 300 of FIG. 3A, the logical inverter circuit 800 of FIG. 8 performs logical inversion rather than polarity inversion. Circuit 800 differs from circuit 700 both structurally and functionally. Structurally, $AC_{OUT}$ is configured to have a DC offset of is $+\Phi0/2$, as opposed to $-\Phi_0/2$ in polarity inverter 700. Functionally, circuit 800 works by an initialization process similar to those described with regard to the functioning of circuit 400 in FIG. 4A.

As one example, shortly after a positive SFQ pulse is introduced to the INPUT of circuit 800, but before it can propagate through the floating Josephson junction $J_F$, $\Phi_0/2$ worth of initializing current is introduced into floating Josephson junction $J_F$ via source DC and transformer coupling $L_{10}/L_9$, which initializing current annihilates the incoming positive input SFQ pulse as it propagates from input to output, but while maintaining the input-side Josephson junctions $J_1$ and $J_2$ in the $2\pi$ superconducting phase, as indicated by stipple-filled superconducting phase dots at Josephson junctions $J_1$ and $J_2$ in FIG. 8. A subsequent negative input SFQ pulse introduced at the INPUT resets input-side Josephson junctions $J_1$ and $J_2$ to the 0 superconducting phase and, propagating through to the output, sets output-side Josephson junctions $J_3$ and $J_4$ to the $2\pi$ superconducting phase. Subject to propagation delay, subsequent alternating positive and negative input SFQ pulses will each cause the circuit to exhibit logical inversion, i.e., cause the circuit to exhibit 0 superconducting phase at the output junctions when the input junctions exhibit $2\pi$ superconducting phase and vice-versa. The transition (at about the 50 picosecond mark) from high to low on the input and from low to high on the output is indicated by the solid dots near Josephson junctions $J_1$ and $J_2$ in FIG. 4A. The solid dots placed on the opposite side of Josephson junctions $J_1$ and $J_2$ from the stipple-filled superconducting phase dots are meant only to indicate a return to 0 superconducting phase and not that the Josephson junctions have transitioned to a $-2\pi$ superconducting phase.

As another initialization example, shortly after a negative SFQ pulse is introduced to the OUTPUT of circuit 800, but before it can propagate through the floating Josephson junction JF, $\Phi_0/2$ worth of initializing current is introduced into floating Josephson junction $J_F$ via source DC and transformer coupling $L_{10}/L_9$, which initializing current annihilates the incoming negative SFQ pulse as it propagates from output to input, but while maintaining the output-side Josephson junctions $J_3$ and $J_4$ in the $2\pi$ superconducting phase. A subsequent positive SFQ pulse introduced at the INPUT sets input-side Josephson junctions $J_1$ and $J_2$ to the $2\pi$ superconducting phase and, propagating through to the output, resets output-side Josephson junctions $J_3$ and $J_4$ to the 0 superconducting phase. Subject to propagation delay, subsequent alternating negative and positive input SFQ pulses will each cause the circuit to exhibit logical inversion, i.e., cause the circuit to exhibit $2\pi$ superconducting phase at the output junctions when the input junctions exhibit 0 superconducting phase and vice-versa.

FIG. 9 is a graph of simulation results for the example logical inverter gate of FIG. 8 having positive central DC flux bias, while FIG. 10 is a graph of simulation results for the example logical inverter gate of FIG. 8 having negative central DC flux bias. Logical inverter 800 works whether the central DC flux bias introduces a positive or negative $\Phi_0/2$. The only difference is in the turn-on transient 1000.

The flow charts of FIGS. 11A and 11B illustrate methods 1100, 1150 of logically inverting a signal value based on single flux quantum (SFQ) pulse inputs. The methods 1100, 1150 can be used, for example, with either of the circuits 400 or 800 of FIG. 4A or 8, respectively. In method 1100 of FIG. 11A, a first positive SFQ pulse is provided 1102 to an input end of a JTL to set an input-side Josephson junction (JJ) in the JTL (i.e., a Josephson junction that is nearer the input end of the JTL than an output end of the JTL) to a $2\pi$ superconducting phase. The JTL can be either a half-twisted JTL as shown in circuit 400 of FIG. 4A or a JTL having a floating Josephson junction in the middle, as in circuit 800 of FIG. 8. Before the input SFQ pulse can propagate through a central loop of the half-twisted JTL to the output, or before the input SFQ pulse can propagate through a central floating Josephson junction of the JTL, as applicable, one $\Phi_0$ of current is injected 1104 into the central loop or $\Phi_0/2$ of current is injected 1106 into the floating Josephson junction as an initializing current, e.g., by turning on one or more DC bias currents. This causes the first positive SFQ pulse to be annihilated by the initializing current, and the first positive SFQ pulse therefore does not propagate through to the output end of the JTL. However, the superconducting phase of the input-side Josephson junction is unaffected, and remains at $2\pi$. Alternatively, turning on a DC bias current to inject 1104, 1106 the applicable amount of current can be performed before providing 1102 the first SFQ pulse, thus reordering actions 1102 and 1104/1106.

Subsequently, a negative SFQ pulse is provided 1108 to the input end of the JTL (half-twisted or having a central floating Josephson junction, as applicable) to reset the input-side Josephson junction to a 0 superconducting phase, such that the negative input SFQ pulse propagates 1110 to the output end of the JTL to set to $2\pi$ the superconducting phase of an output-side Josephson junction (i.e., a Josephson junction in the JTL that is nearer the output end of the JTL than the input end of the JTL). Thus, logical inversion is provided.

The method 1100 of FIG. 11A can further include providing 1112 a second positive SFQ pulse to the input end of the JTL (half-twisted or otherwise) to set the input-side Josephson junction to a $2\pi$ superconducting phase, such that the second positive SFQ pulse propagates 1114 to the output end of the JTL to reset to 0 the superconducting phase of the output-side Josephson junction. This again demonstrates that the logical inversion function is correctly implemented.

In method 1150 of FIG. 11B, a first negative SFQ pulse is provided 1152 to an output end of a JTL to set an output-side Josephson junction in the JTL to a $2\pi$ superconducting phase. The JTL can be either a half-twisted JTL as shown in circuit 400 of FIG. 4A or a JTL having a floating Josephson junction in the middle, as in circuit 800 of FIG. 8. Before the output SFQ pulse can propagate through a central loop of the half-twisted JTL to the input, or before the output SFQ pulse can propagate through a central floating Josephson junction of the JTL, as applicable, one $\Phi_0$ of current is injected 1154 into the central loop or $\Phi_0/2$ of current is injected 1156 into the floating Josephson junction as an initializing current, e.g., by turning on one or more DC bias currents. This causes the first negative SFQ pulse to be annihilated by the initializing current, and the first negative SFQ pulse therefore does not propagate through to the input end of the JTL. However, the superconducting phase of the output-side Josephson junction is unaffected, and remains at $2\pi$. Alternatively, turning on a DC bias current to inject 1154, 1156 the applicable amount of current can be performed before providing 1152 the first SFQ pulse, thus reordering actions 1152 and 1154/1156.

Subsequently, a positive SFQ pulse is provided 1158 to the input end of the JTL (half-twisted or having a central floating Josephson junction, as applicable) to set the input-side Josephson junction to a $2\pi$ superconducting phase, such that the positive input SFQ pulse propagates 1160 to the output end of the JTL to reset to 0 the superconducting phase of an output-side Josephson junction. Thus, logical inversion is provided. Alternatively, rather than providing 1152 a first positive pulse to the input end of the JTL, the first pulse applied 1102 can be a negative pulse applied to the output of a first positive pulse to the input—anything that gets to input and output initialized opposite each other is good.

The method 1150 of FIG. 11B can further include providing 1162 a second negative SFQ pulse to the input end of the JTL (half-twisted or otherwise) to reset the input-side Josephson junction to a 0 superconducting phase, such that the second negative SFQ pulse propagates 1164 to the output end of the JTL to set to $2\pi$ the superconducting phase of the output-side Josephson junction. This again demonstrates that the logical inversion function is correctly implemented. It will be appreciated that either method 1100 or 1150 can be modified in various ways. Any reordering of the actions or modification of the actions that still results in an input Josephson junction and an output Josephson junction to be initialized to have superconducting phases opposite each other (i.e., one being 0 when the other is $2\pi$, or vice-versa) will thereafter result in the desired logical inversion.

The methods 1100, 1150 described above can also include the actions of providing appropriate AC biasing as discussed previously in this disclosure to induce the timely triggering of Josephson junctions in the JTL and thus to cause signal propagation from input to output.

The example inverter gates described herein by the gate schematics and accompanying description can perform logical inversion for Josephson circuits that use RQL data encoding. They achieve an efficient implementation of logical inversion while eliminating the need for magnetic transformers in the signal path.

The Josephson inverter gates described herein have very good parametric operating margins, a low component count, and provide efficiency and cost advantages as compared to other inverter implementations. By eliminating high-efficiency transformers in their designs, the Josephson inverter gates described herein can save a number of metal layers, e.g., two metal layers, in the fabrication process, which sets the number of process steps and yield and thereby determines cost. The Josephson inverter gates described herein can be fabricated according to either a half-twist JTL signal path approach that involves switching the location of signal and ground at the output to produces signal inversion, or an approach involving an unshunted floating Josephson junction in the signal line to produces two SFQ pulses when triggered by the SFQ input signal, which results in an output SFQ signal of reversed polarity. This latter implementation, as shown in FIGS. 7 and 8, is schematically simpler but has narrower parametric operating margins than the half-twisted JTL implementation shown in FIGS. 3A and 4A.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on. The term "functionally equal" as used herein means sufficiently equal such that the described inverter functioning is achieved, and not necessarily exactly equal.

What is claimed is:

1. A Josephson inverter gate circuit comprising:
   an input to provide an input signal comprising at least one single flux quantum (SFQ) pulse;
   a Josephson transmission line (JTL) comprising at least four Josephson junctions arranged to propagate the input signal to an output, and, additionally, a floating Josephson junction in a central portion of the JTL, by which the JTL is arranged to invert the input signal into an output signal,
   wherein the inverter gate circuit is a reciprocal quantum logic (RQL) inverter capable of inverting the input signal encoded with RQL data encoding having SFQ pulses of either positive or negative polarity.

2. The circuit of claim 1, further comprising a DC input configured to provide an initializing current to the floating Josephson junction.

3. The circuit of claim 2, wherein the initializing current is $\Phi_0/2$ of current.

4. The circuit of claim 1, further comprising at least two bias inputs each providing a bias signal having an AC component.

5. The circuit of claim 4, wherein the AC component of a first of the at least two bias signals is 180° out of phase with the AC component of a second of the at least two bias signals.

6. The circuit of claim 4, wherein a first of the at least two bias inputs is closer to the input than to the output of the gate circuit and a second of the at least two bias inputs is closer to the output than to the input of the gate circuit, and wherein a DC offset of the bias signal of the second bias input is $-\Phi_0/2$, such that the gate circuit is a polarity inverter.

7. The circuit of claim 4, wherein a first of the at least two bias inputs is closer to the input than to the output of the gate circuit and a second of the at least two bias inputs is closer to the output than to the input of the gate circuit, and wherein a DC offset of the bias signal of the second bias input is $+\Phi_0/2$, such that the gate circuit is a logical inverter.

8. The circuit of claim 1, wherein the JTL comprises:
   an input end comprising the input connected to an input node and:
      a first inductor connected between the input node and a first node;
      a first Josephson junction of the at least four Josephson junctions connected between the first node and a circuit ground;
      a second inductor connected between the first node and a second node;
      a third inductor connected between the second node and a third node; and
      a second Josephson junction of the at least four Josephson junctions connected between the third node and the circuit ground;
   an output end comprising the output connected to an output node and:
      a third Josephson junction of the at least four Josephson junctions connected between a fifth node and the circuit ground;
      a fourth inductor connected between the fifth node and a sixth node;
      a fifth inductor connected between the sixth node and a seventh node;
      a fourth Josephson junction of the at least four Josephson junctions connected between the seventh node and the circuit ground; and
      a sixth inductor connected between the seventh node and the output node;
   wherein the central portion connects the input end and the output end, the central portion further comprising a transformer-coupled DC flux bias injection source configured to inject $\Phi_0/2$ of current.

9. The circuit of claim 8, further comprising:
   a first bias input arranged to provide to the input end of the JTL a first bias signal having a first AC component via a seventh inductor connected to the second node; and
   a second bias input arranged to provide to the output end of the JTL a second bias signal having a second AC component via an eighth inductor connected to the sixth node.

10. The circuit of claim 9, wherein the first AC component is 180° out of phase with the second AC component.

11. The circuit of claim 9, wherein a DC offset of the second bias signal is $-\Phi_0/2$, such that the gate circuit is a polarity inverter.

12. The circuit of claim 9, wherein a DC offset of the second bias signal is $+\Phi_0/2$, such that the gate circuit is a logical inverter.

13. A method of logically inverting a signal value based on single flux quantum (SFQ) pulse inputs, the method comprising:

provide a first positive SFQ pulse to an input end of a Josephson transmission line (JTL) to set an input-side Josephson junction in the JTL that is nearer the input end of the JTL than an output end of the JTL to a $2\pi$ superconducting phase, the JTL having a floating Josephson junction in a central portion of the JTL between the input and output ends of the JTL;

before or after providing the first positive SFQ pulse, but before the first positive SFQ pulse can propagate through the central portion of the JTL to the output end of the JTL, injecting one $\Phi_0/2$ of current into the floating Josephson junction as an initializing current, such that the first positive SFQ pulse is annihilated by the initializing current and does not propagate through to the output end of the JTL, without affecting the superconducting phase of the input-side Josephson junction; and providing a negative SFQ pulse to the input end of the JTL to reset the input-side Josephson junction to a 0 superconducting phase, such that the negative SFQ pulse propagates to the output end of the JTL to set to $2\pi$ the superconducting phase of an output-side Josephson junction in the JTL that is nearer the output end of the JTL than the input end of the JTL.

14. The method of claim 13, further comprising:
providing a second positive SFQ pulse to the input end of the JTL to set the input-side Josephson junction to a $2\pi$ superconducting phase, such that the second positive SFQ pulse propagates to the output end of the JTL to reset to 0 the superconducting phase of the output-side Josephson junction.

15. The method of claim 13, further comprising providing to the input end of the JTL a first bias signal having a first AC component and providing to the output end of the JTL a second bias signal having a second AC component, wherein a DC offset of the second bias signal is $+\Phi_0/2$.

16. A method of logically inverting a signal value based on single flux quantum (SFQ) pulse inputs, the method comprising:

providing a first negative SFQ pulse to an output end of a Josephson transmission line (JTL) to set an output-side Josephson junction in the JTL that is nearer the output end of the JTL than an input end of the JTL to a $2\pi$ superconducting phase, the JTL having a central portion between the input and output ends of the JTL;

before or after providing the first negative SFQ pulse, but before the first negative SFQ pulse can propagate through the central portion of the JTL to the input end of the JTL, injecting one of:

one $\Phi_0$ of current into a central loop in the central portion of the JTL as an initializing current, such that the first negative SFQ pulse is annihilated by the initializing current and does not propagate through to the input end of the JTL, without affecting the superconducting phase of the output-side Josephson junction, or one $\Phi_0/2$ of current into a floating Josephson junction in the central portion of the JTL as an initializing current, such that the first negative SFQ pulse is annihilated by the initializing current and does not propagate through to the input end of the JTL, without affecting the superconducting phase of the output-side Josephson junction; and providing a positive SFQ pulse to the input end of the JTL to set to a $2\pi$ superconducting phase an input-side Josephson junction that is nearer the input end of the JTL than the output end of the JTL, such that the positive SFQ pulse propagates to the output end of the JTL to reset to 0 the superconducting phase of the output-side Josephson junction.

17. The method of claim 16, further comprising:
providing a second negative SFQ pulse to the input end of the JTL to reset the input-side Josephson junction to a 0 superconducting phase, such that the second negative SFQ pulse propagates to the output end of the JTL to set to $2\pi$ the superconducting phase of the output-side Josephson junction.

18. The method of claim 16, wherein one $\Phi_0/2$ of current is injected into the floating Josephson junction in the central portion of the JTL, the method further comprising providing to the input end of the JTL a first bias signal having a first AC component and providing to the output end of the JTL a second bias signal having a second AC component, wherein a DC offset of the second bias signal is $+\Phi_0/2$.

19. The method of claim 16, wherein one $\Phi_0$ of current is injected into the central loop, and the JTL is a half-twisted JTL, wherein each end of the half-twisted JTL comprises a signal propagation side and a ground side, the signal propagation side of the input end being the ground side of the output end and the ground side of the input end being the signal propagation side of the output end.

20. The method of claim 19, wherein the injecting the $\Phi_0$ of current into the central loop comprises providing $\Phi_0/2$ flux bias to the central loop via each of two Josephson junctions each arranged in parallel with inductors in the central loop.

* * * * *